(12) United States Patent
Sakai et al.

(10) Patent No.: US 8,039,280 B2
(45) Date of Patent: Oct. 18, 2011

(54) LIGHT EMITTING DIODE AND METHOD OF FABRICATING THE SAME

(75) Inventors: Shiro Sakai, Tokushima (JP); Yoshiki Naoi, Tokushima (JP)

(73) Assignees: Seoul Opto Device Co., Ltd., Ansan-si (KR); The University of Tokushima, Tokushima (JP)

( * ) Notice: Subject to any disclaimer, the term of this patent is extended or adjusted under 35 U.S.C. 154(b) by 16 days.

(21) Appl. No.: 12/601,165

(22) PCT Filed: May 16, 2008

(86) PCT No.: PCT/KR2008/002726
§ 371 (c)(1), (2), (4) Date: Nov. 20, 2009

(87) PCT Pub. No.: WO2008/143428
PCT Pub. Date: Nov. 27, 2008

(65) Prior Publication Data
US 2010/0171136 A1    Jul. 8, 2010

(30) Foreign Application Priority Data

May 22, 2007   (KR) .................. 10-2007-0049848

(51) Int. Cl.
*H01L 21/00* (2006.01)
(52) U.S. Cl. ............... 438/29; 438/22; 438/27; 438/47; 257/79; 257/94; 257/95; 257/98; 257/E33.067
(58) Field of Classification Search ................ 257/79, 257/94, 95, 98; 438/22, 27, 29, 47
See application file for complete search history.

(56) References Cited

U.S. PATENT DOCUMENTS

| 2002/0197764 A1 | 12/2002 | Uemura et al. |
| 2004/0104672 A1* | 6/2004 | Shiang et al. .................. 313/506 |
| 2005/0145864 A1* | 7/2005 | Sugiyama et al. .............. 257/95 |
| 2007/0001181 A1* | 1/2007 | Chen .............................. 257/98 |
| 2008/0273562 A1* | 11/2008 | Hasegawa et al. ......... 372/44.01 |

FOREIGN PATENT DOCUMENTS

| CN | 1272557 | 11/2000 |
| CN | 1893123 | 1/2007 |
| JP | 2002368261 | 12/2002 |
| JP | 2002368263 | 12/2002 |
| KR | 1020060120947 | 11/2006 |

OTHER PUBLICATIONS

Office Action issued by The State Intellectual Property Office of P.R. China on Oct. 12, 2010 in corresponding Chinese Patent Application No. 200880016875.3.

* cited by examiner

*Primary Examiner* — Wai Sing Louie
(74) *Attorney, Agent, or Firm* — H.C. Park & Associates, PLC

(57) ABSTRACT

The present invention provides a method of fabricating a light emitting diode, which comprises the steps of forming a compound semiconductor layer on a substrate, the compound semiconductor layer including a lower semiconductor layer, an active layer and an upper semiconductor layer; and scratching a surface of the substrate by rubbing the substrate with an abrasive. According to the present invention, the abrasive is used to rub and scratch the surface of the light emitting diode, thereby making it possible to cause the light emitted from the active layer to effectively exit to the outside. Therefore, the light extraction efficiency of the light emitting diode can be improved.

23 Claims, 26 Drawing Sheets

[FIG 1]
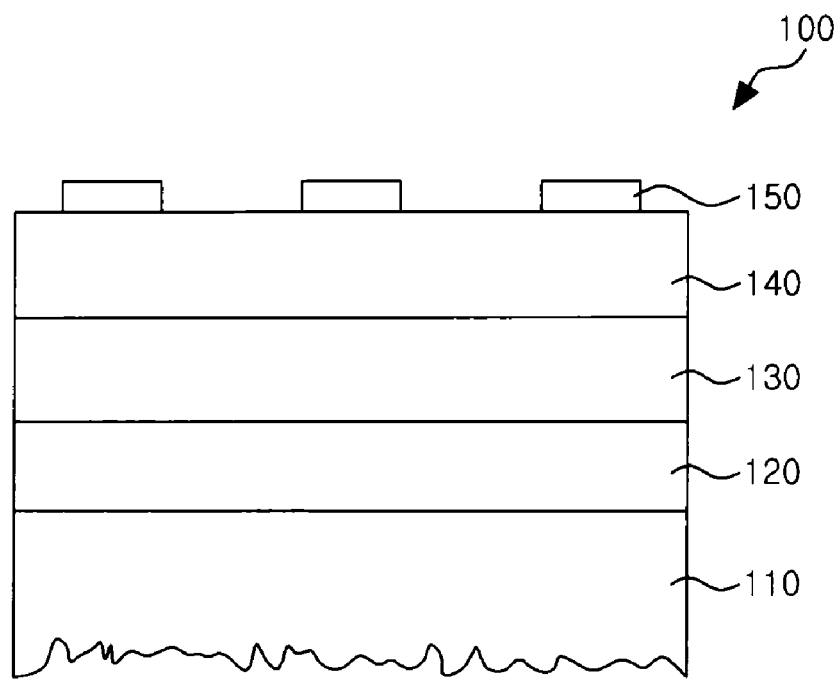

[FIG 2]
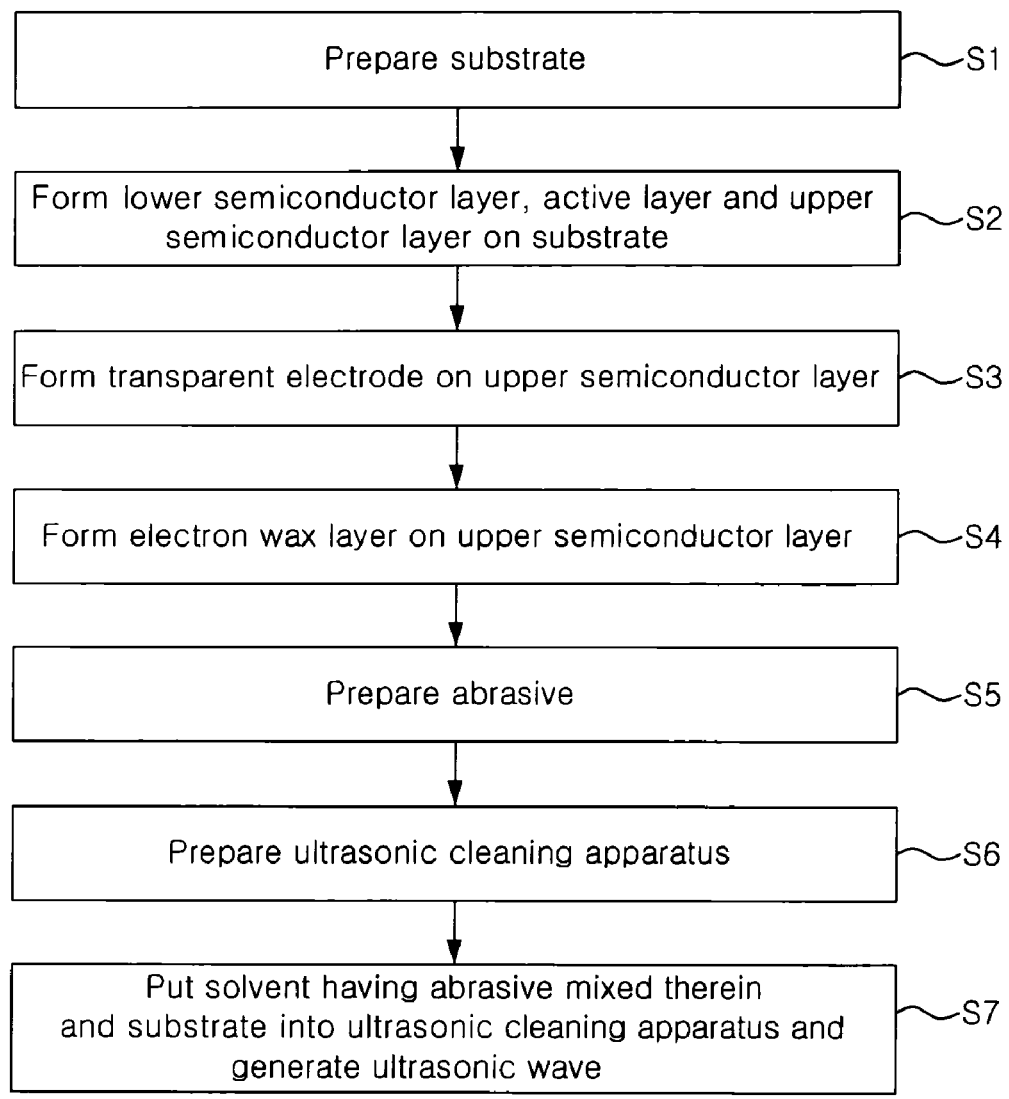

[FIG 3]
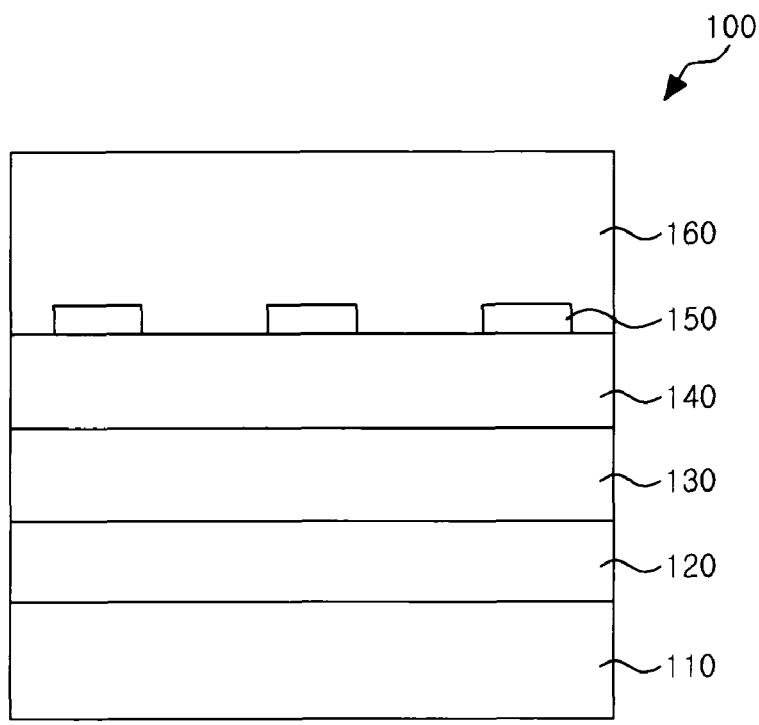
[FIG 4]
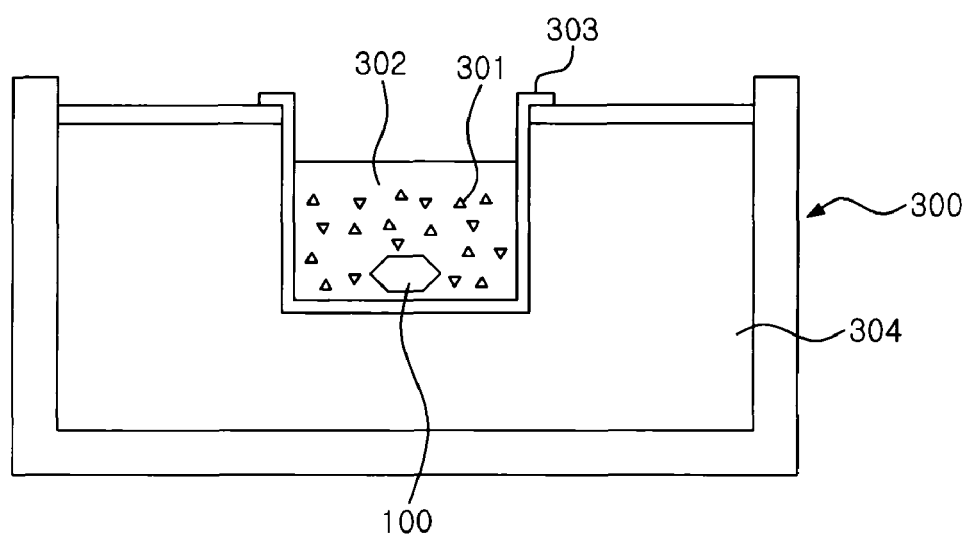

[FIG 5]
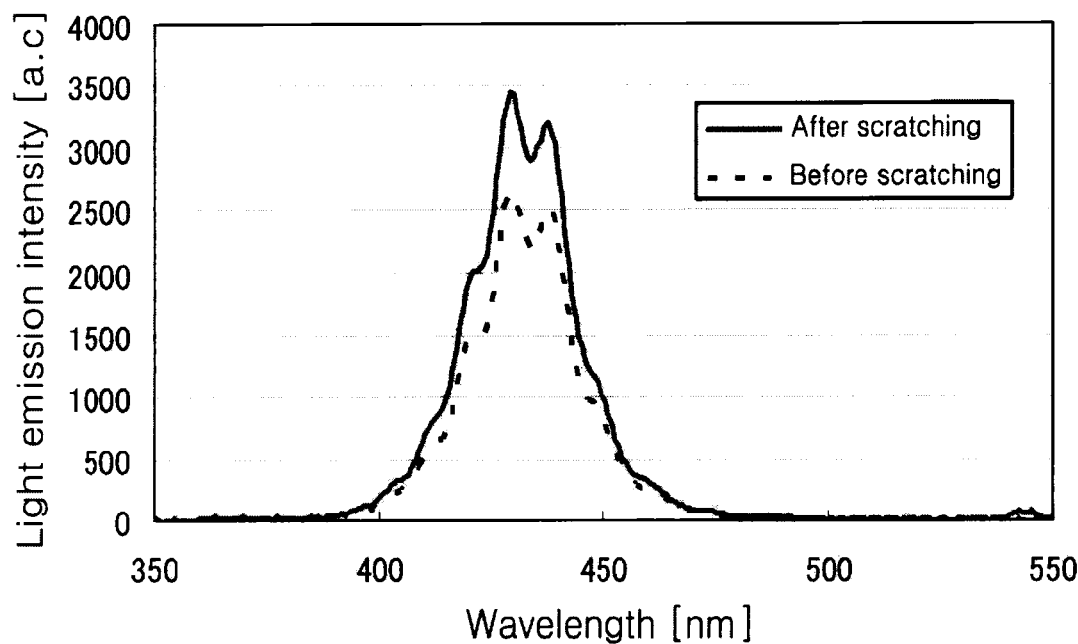
[FIG 6]
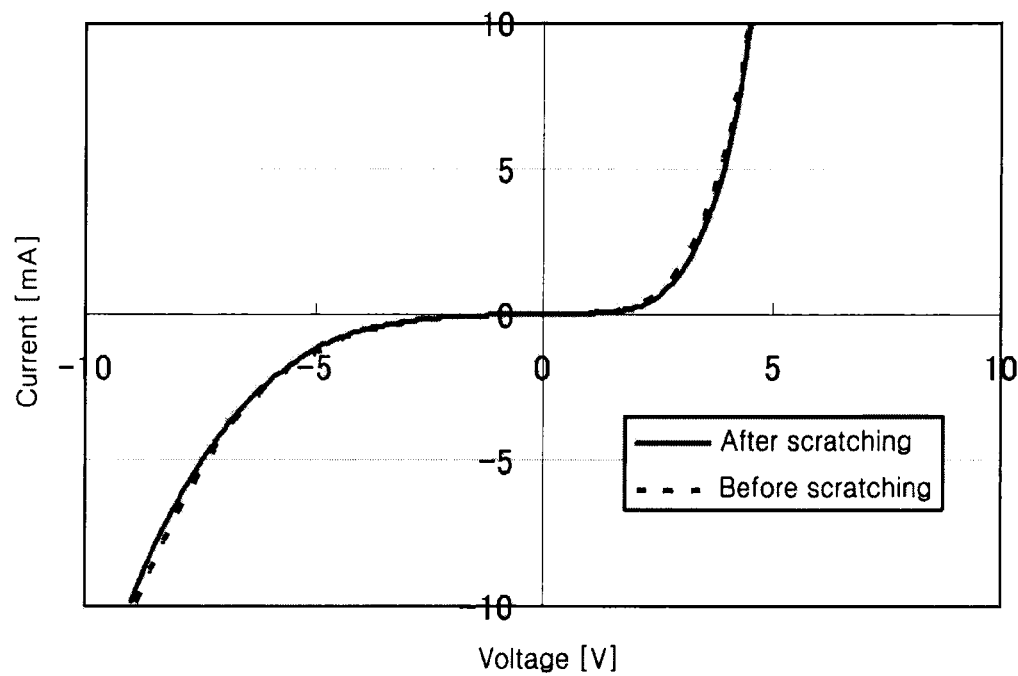

[FIG 7]
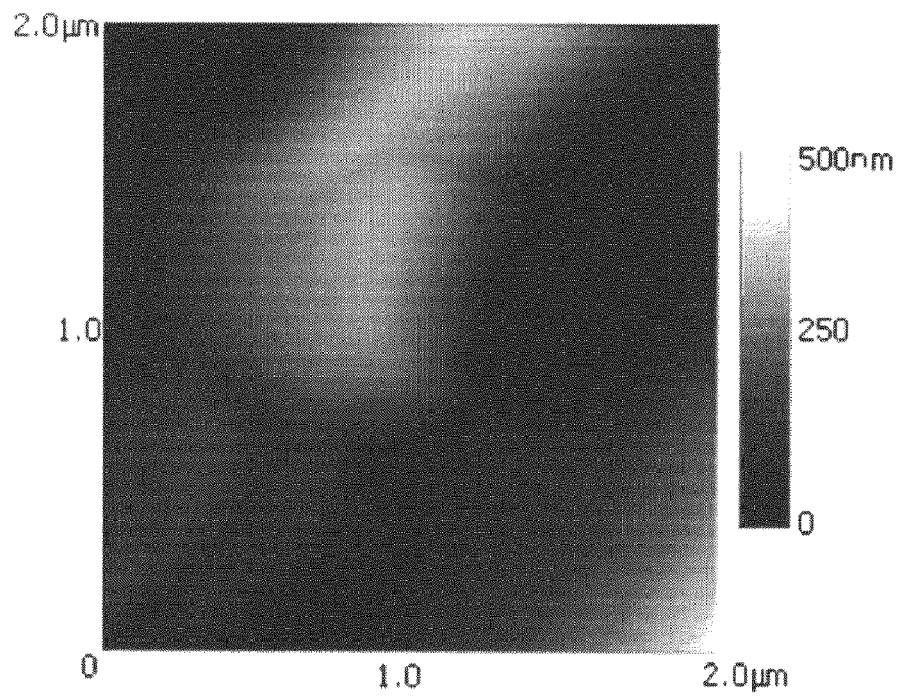
[FIG 8]
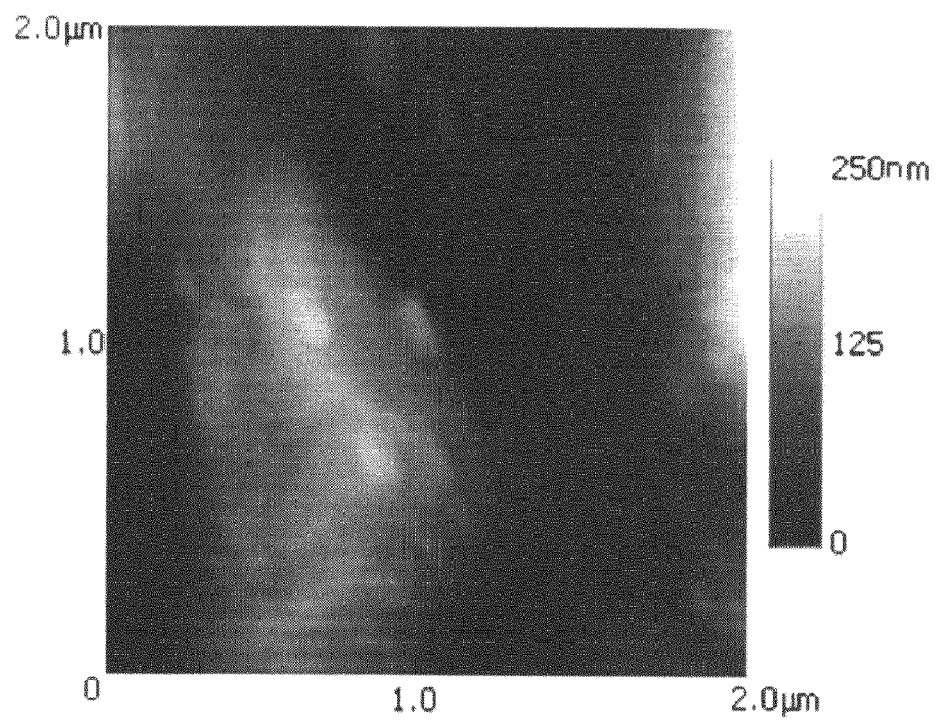

[FIG 9]
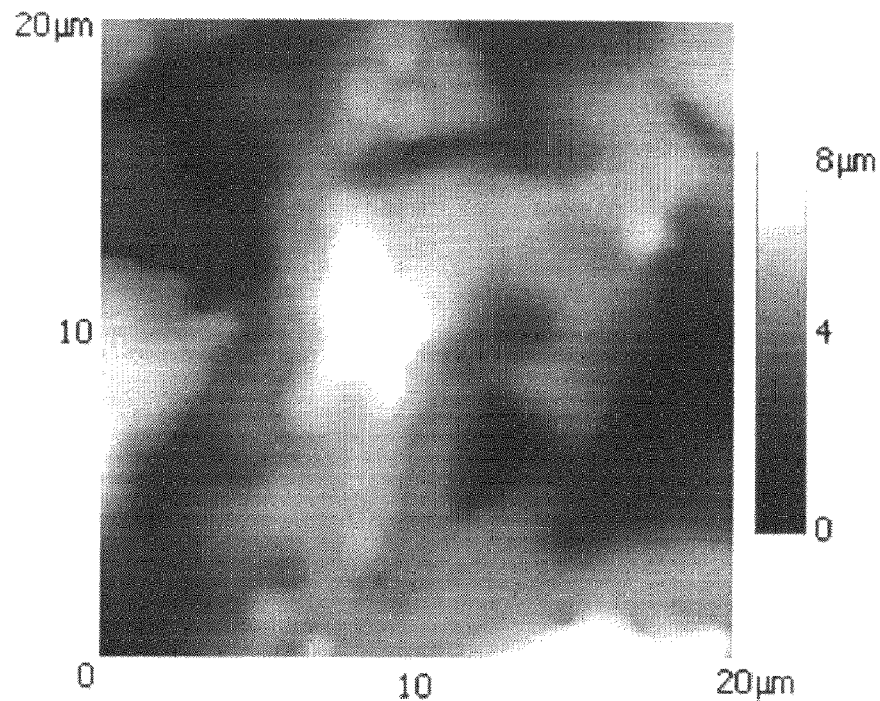
[FIG 10]
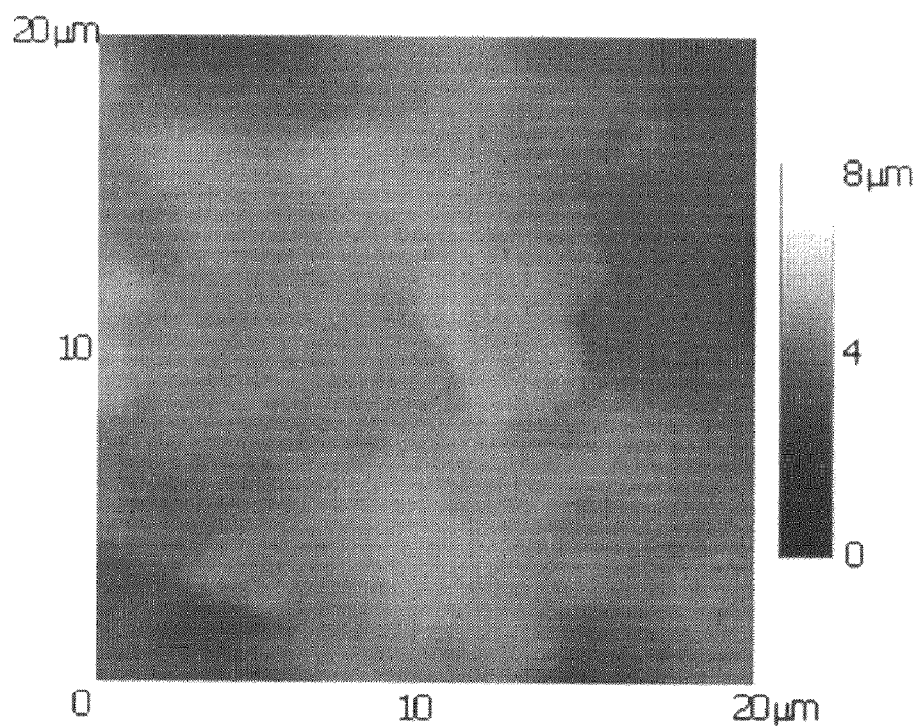

[FIG 11]
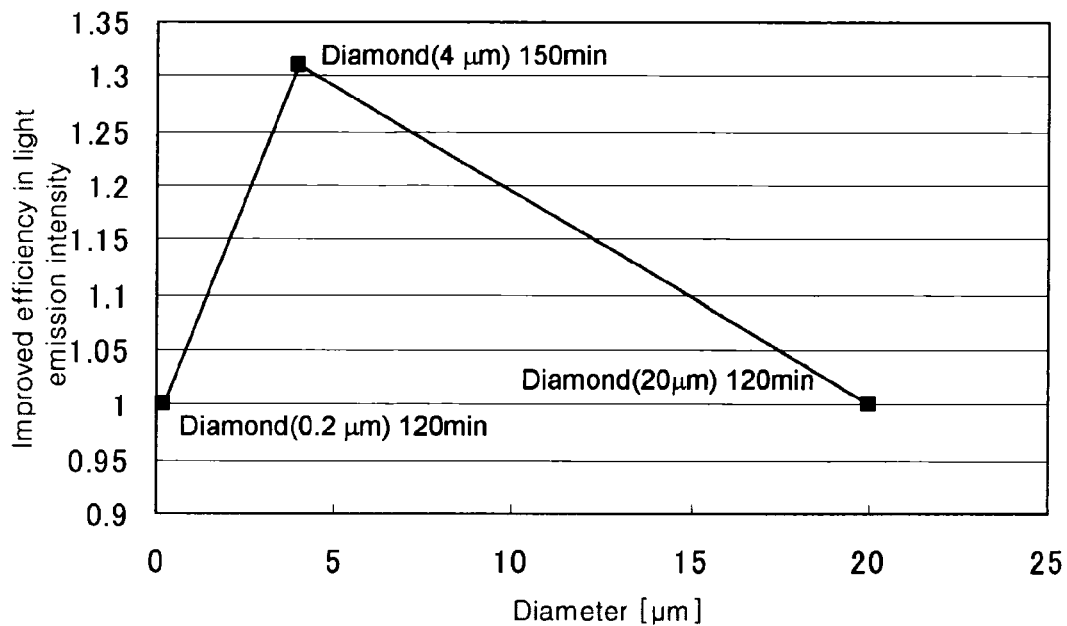
[FIG 12]
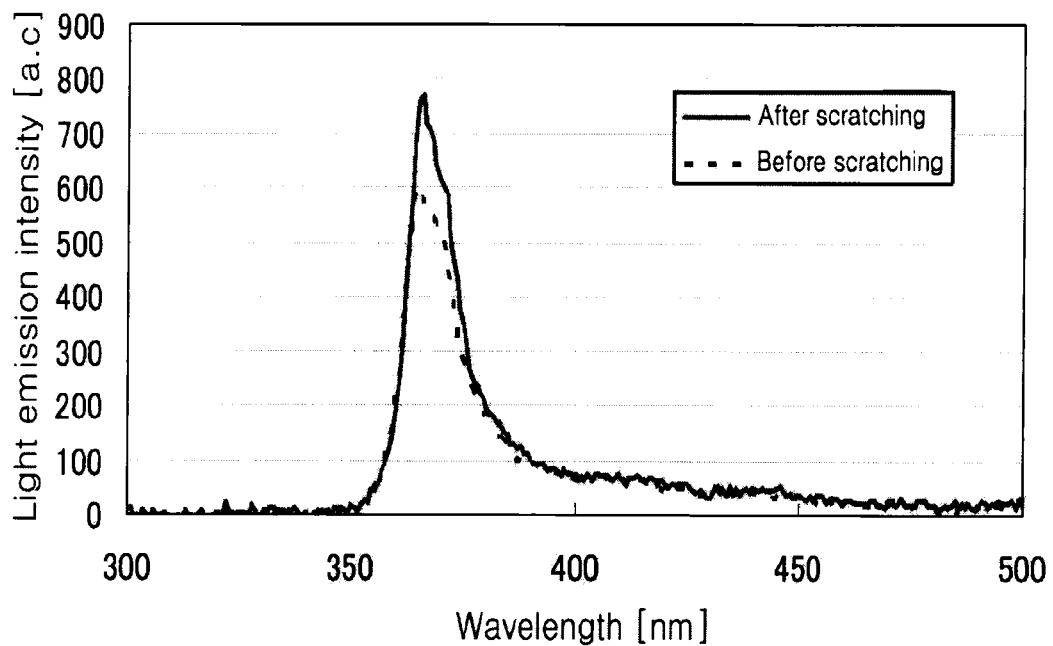

[FIG 13]
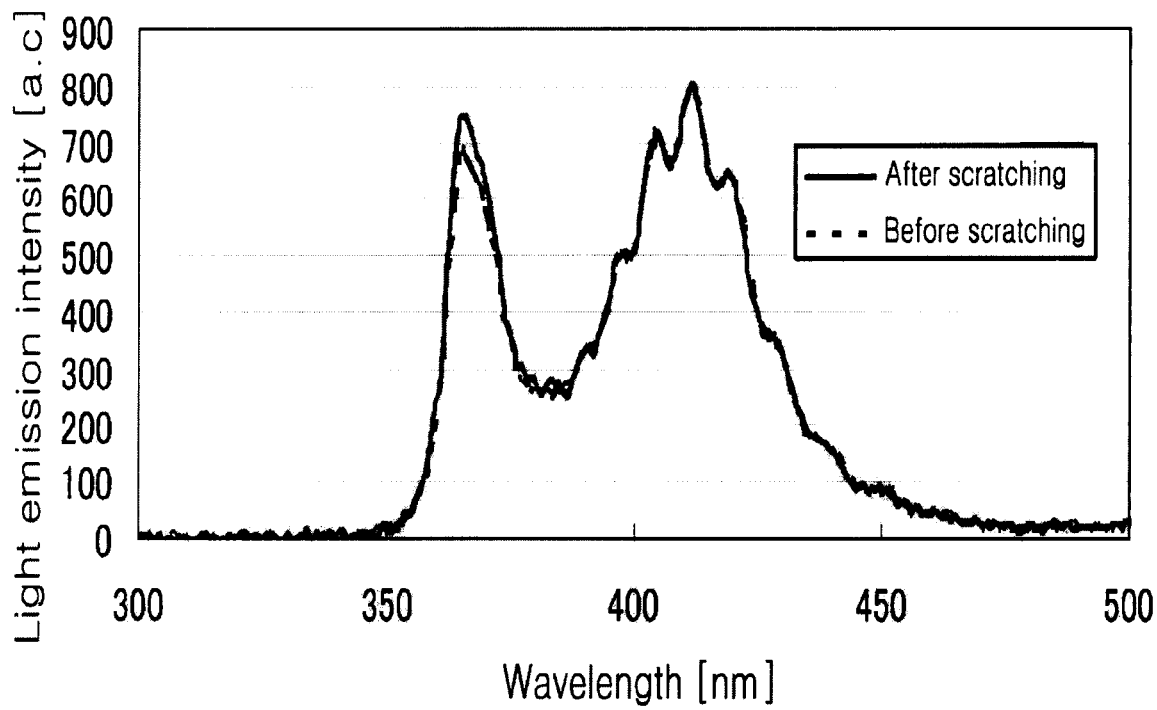
[FIG 14]
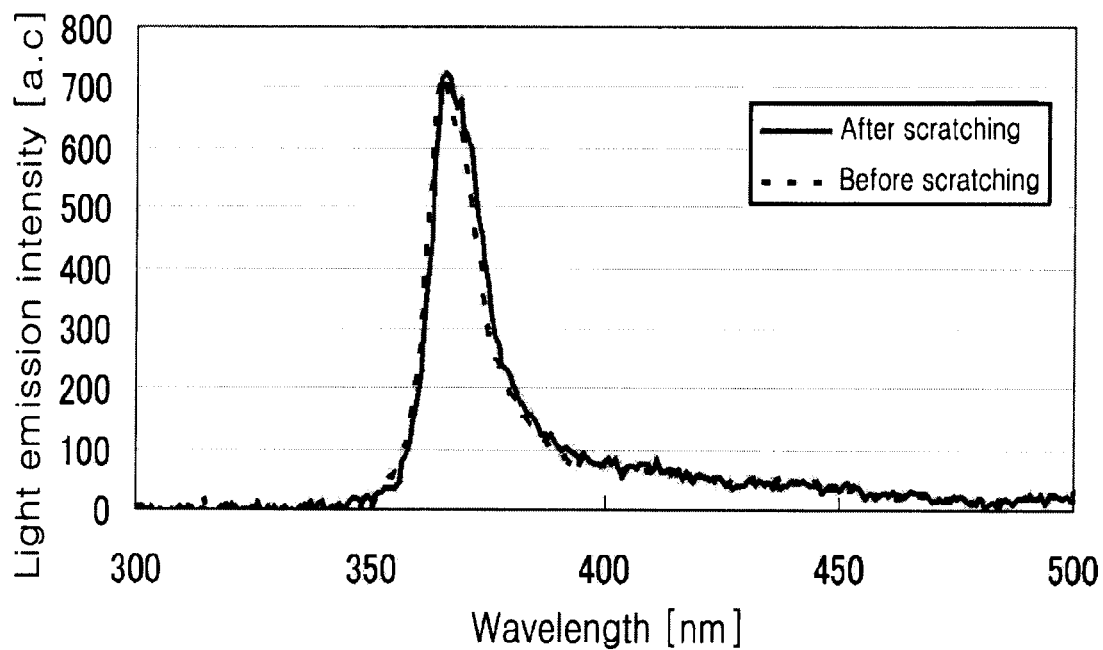

[FIG 15]
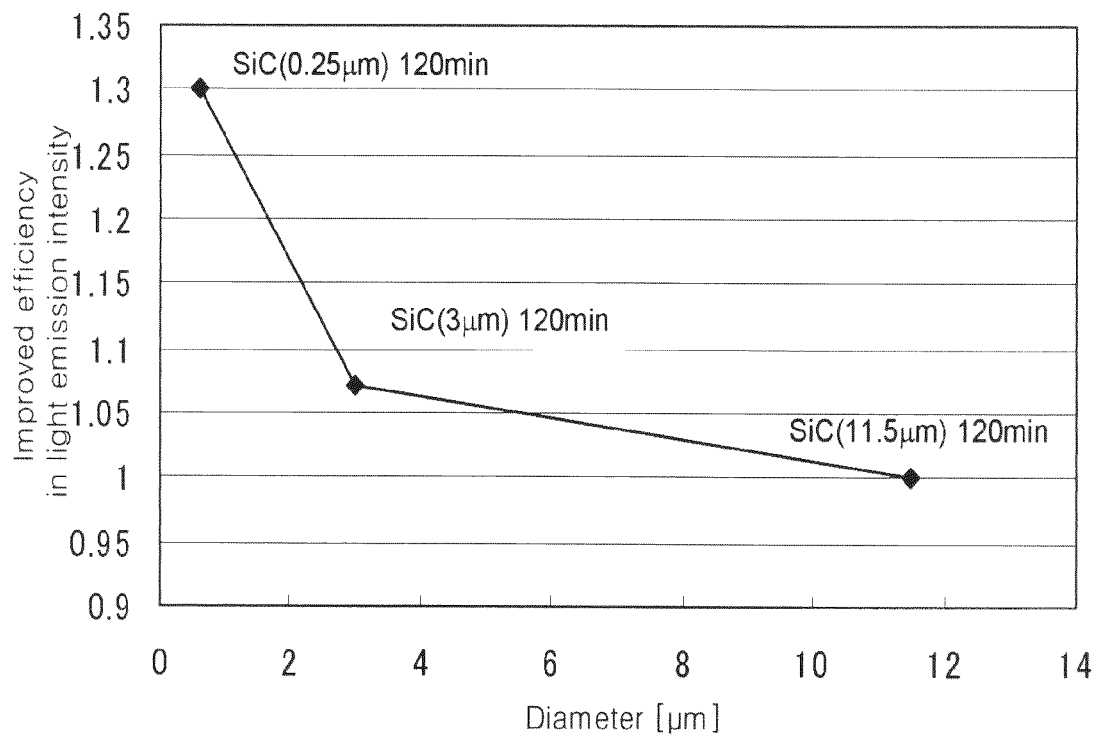
[FIG 16]
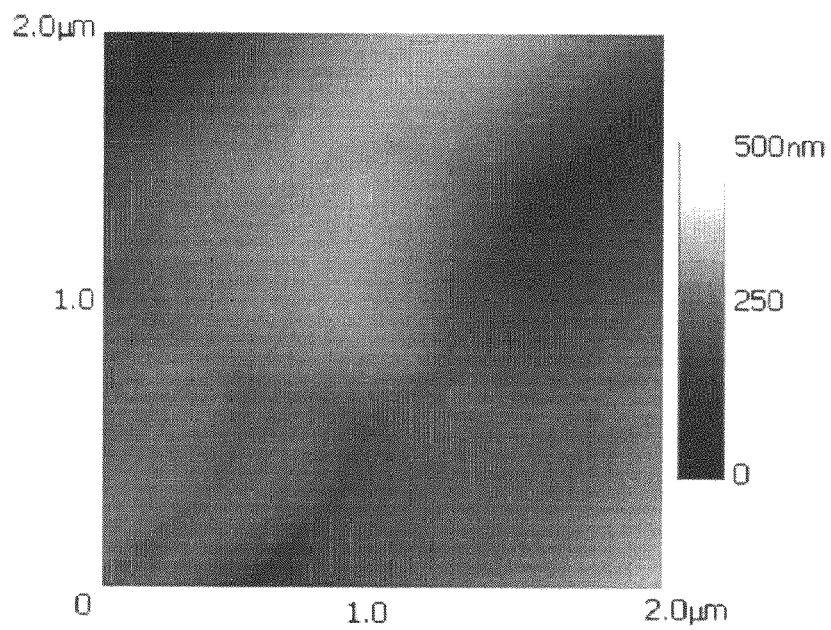

[FIG 17]
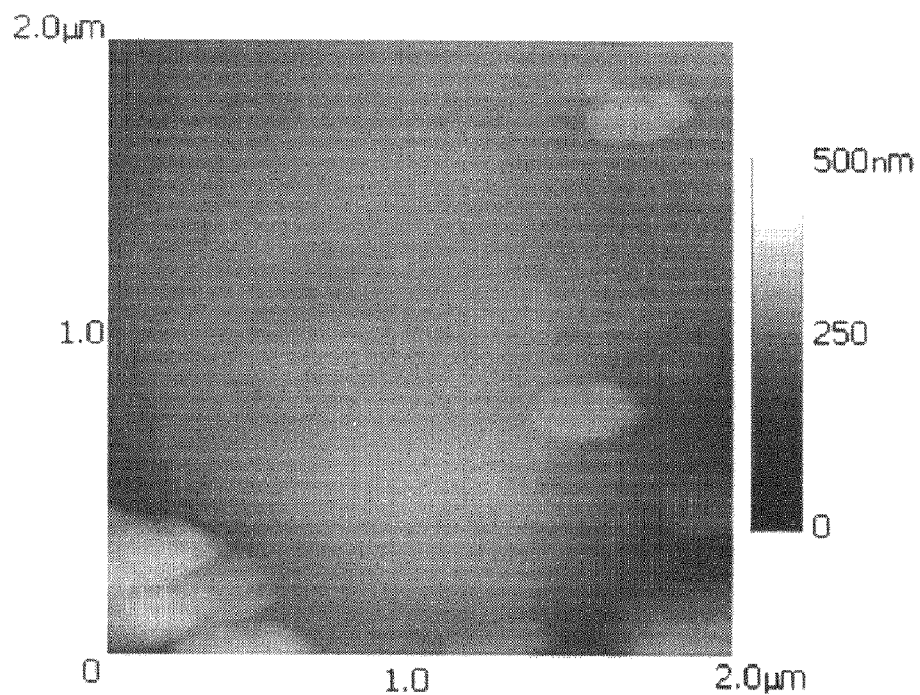
[FIG 18]
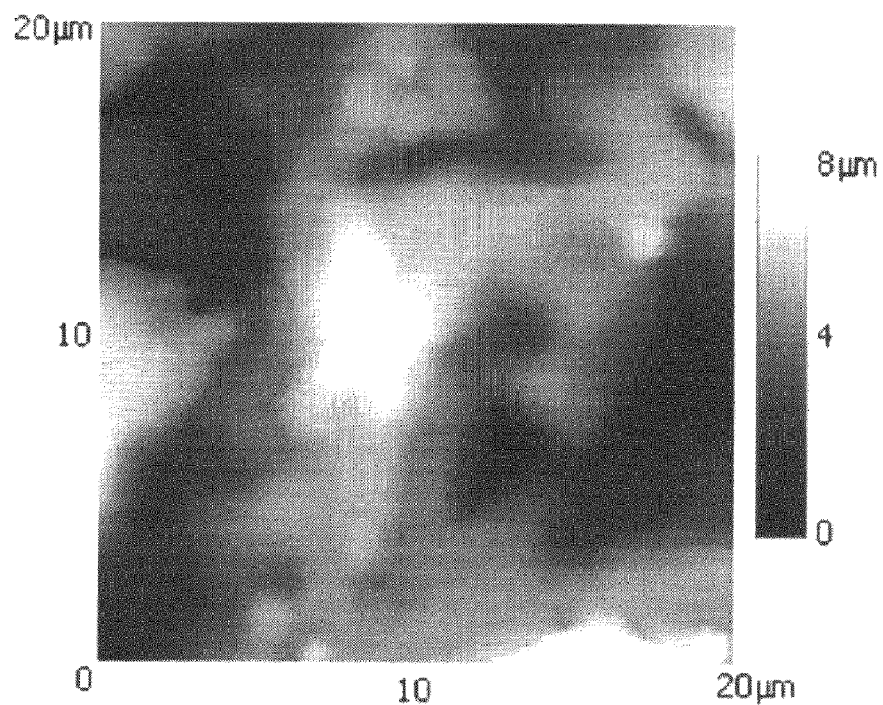

[FIG 19]
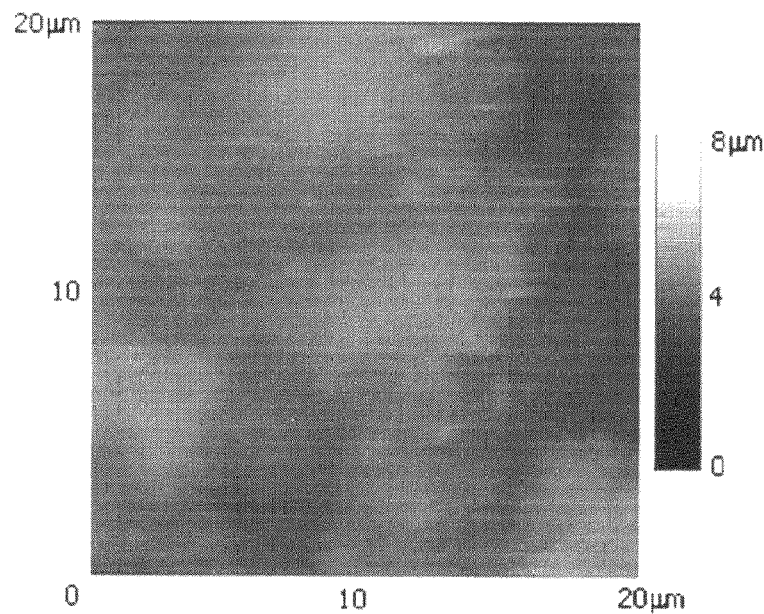
[FIG 20]
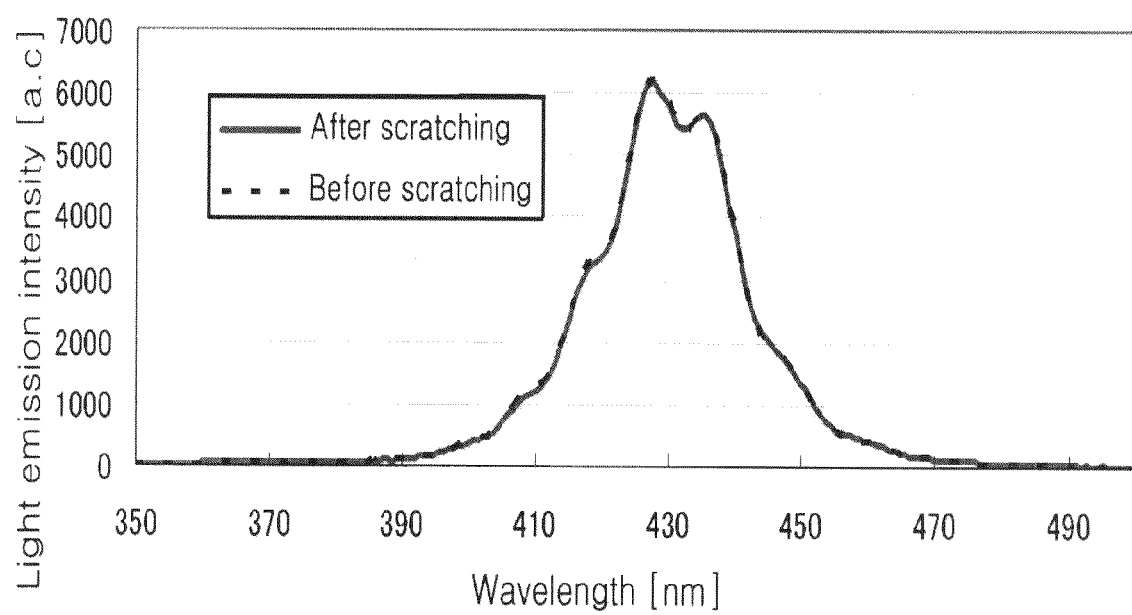

[FIG 21]
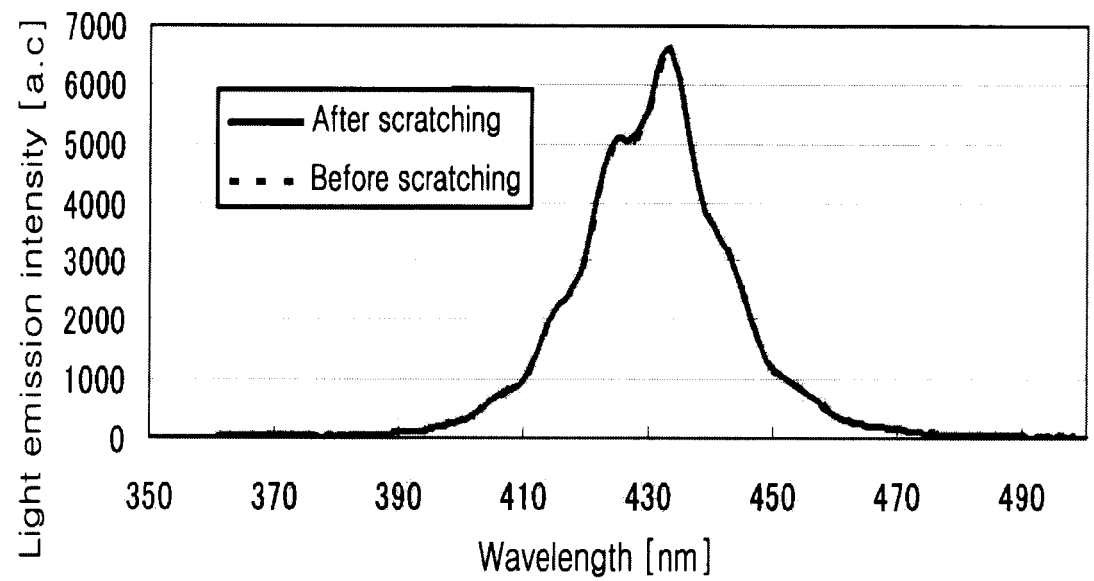
[FIG 22]
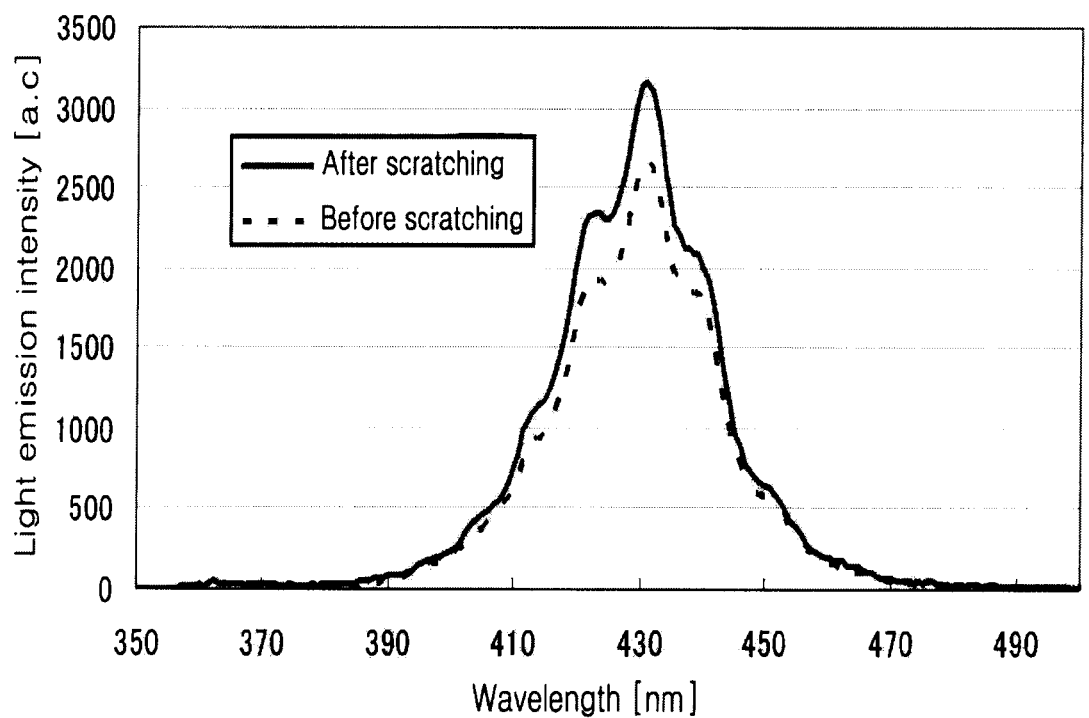

[FIG 23]
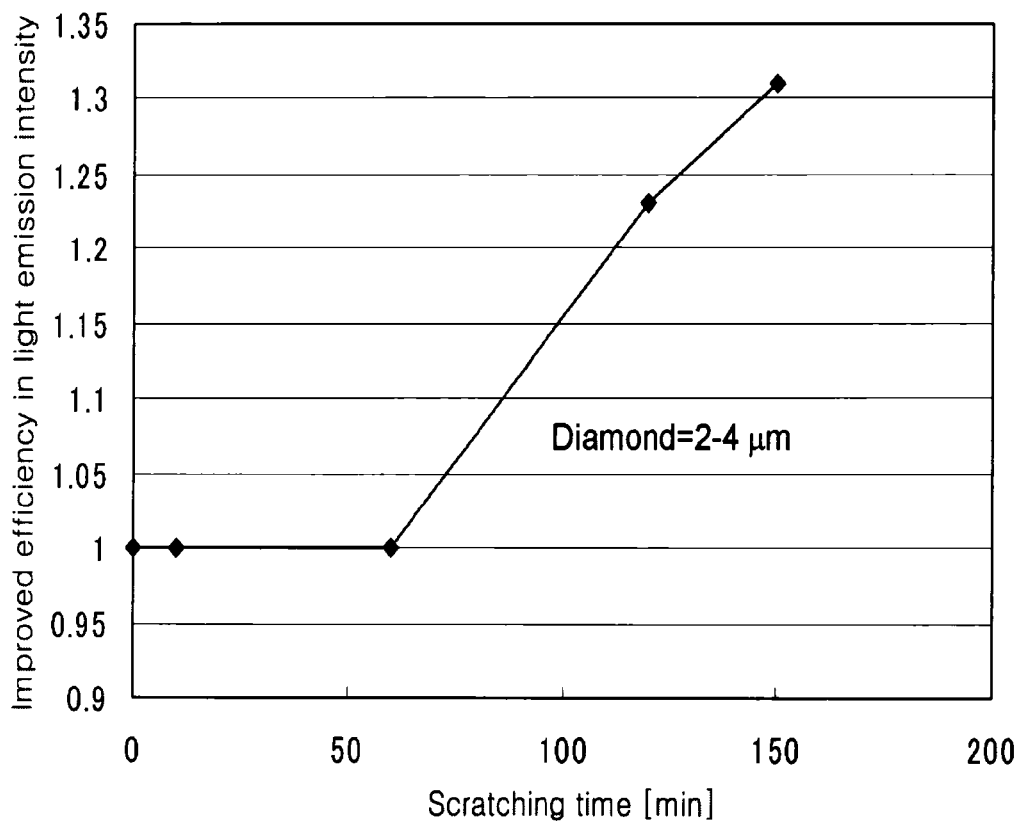
[FIG 24]
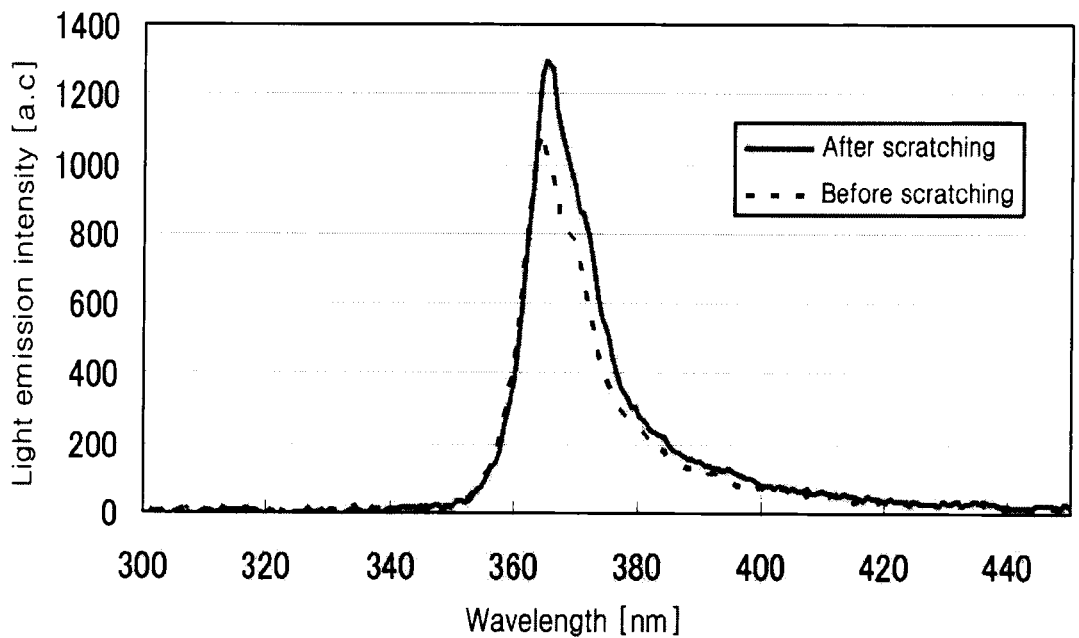

[FIG 25]
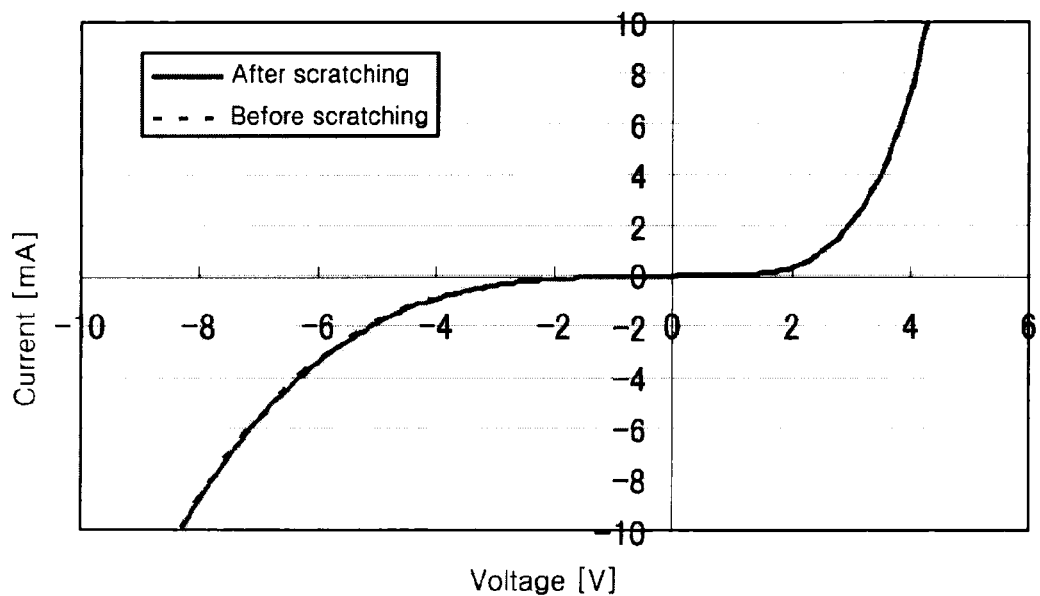
[FIG 26]
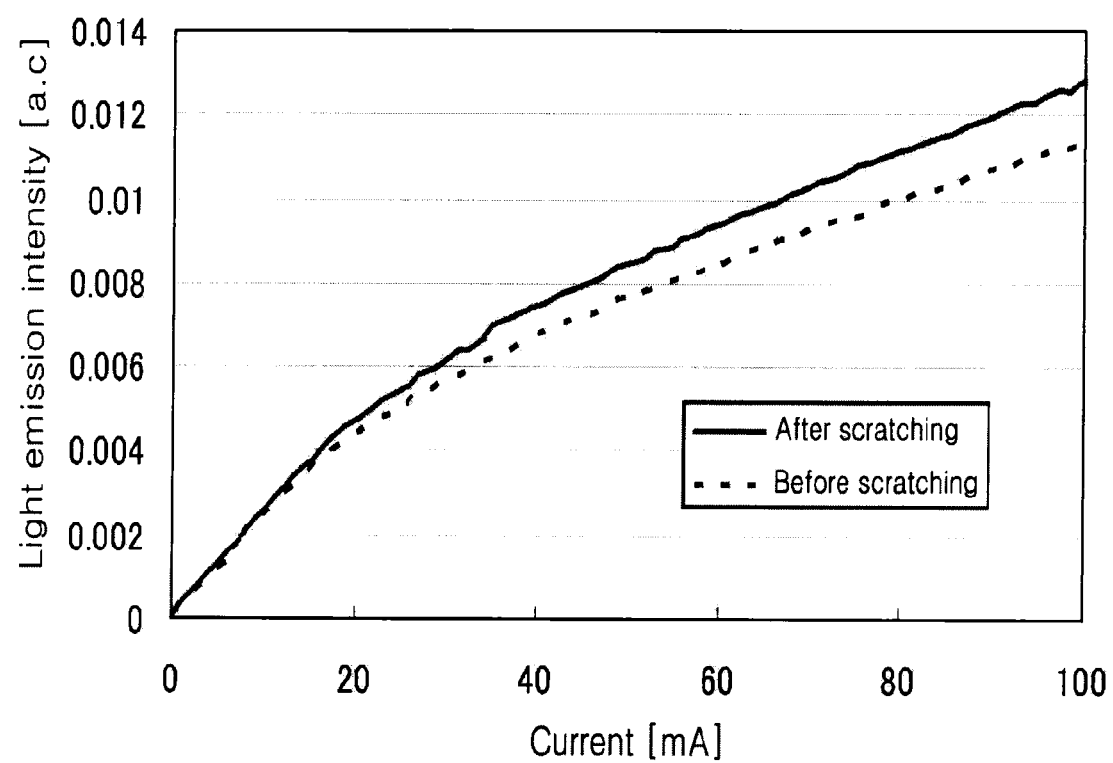

[FIG 27]
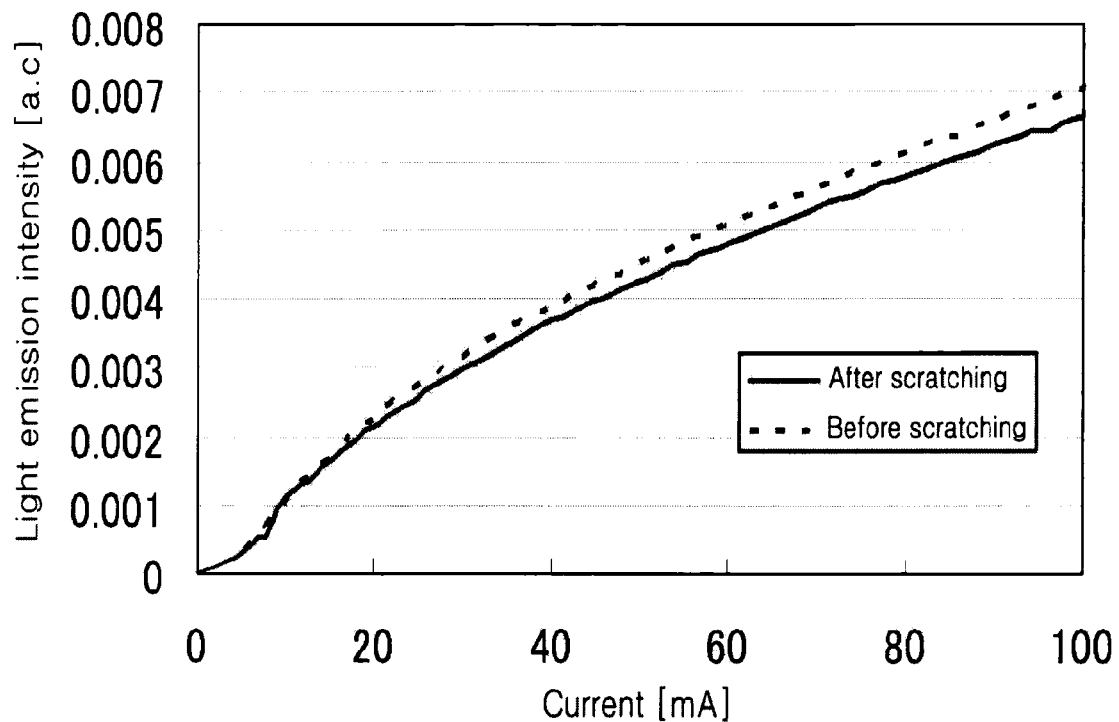
[FIG 28]
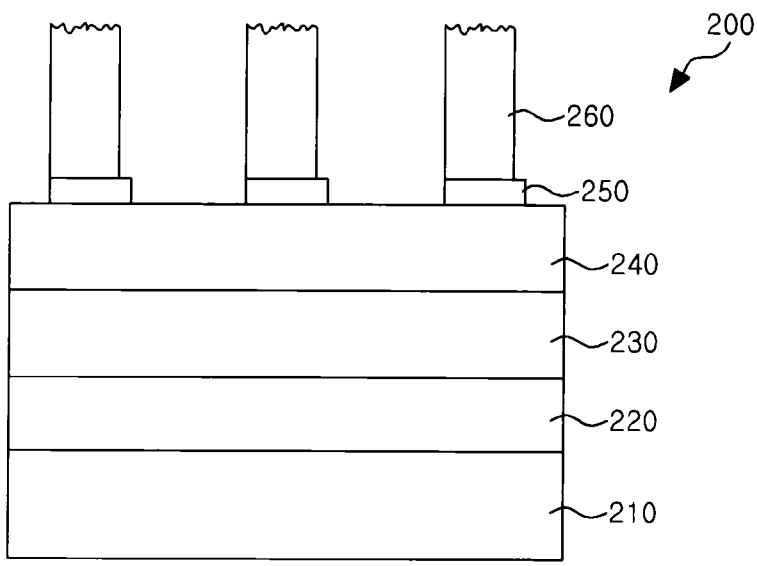

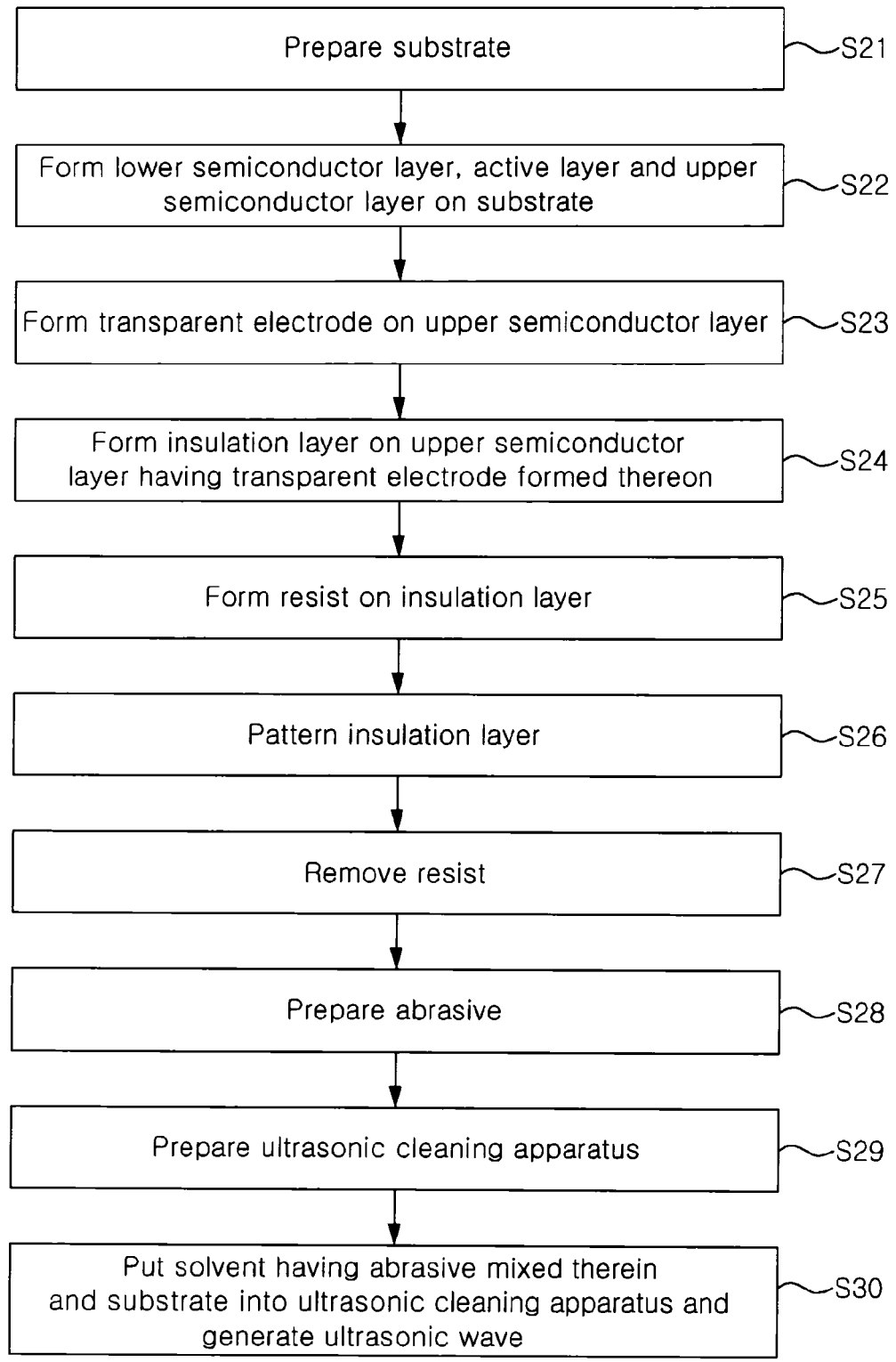

[FIG 30]
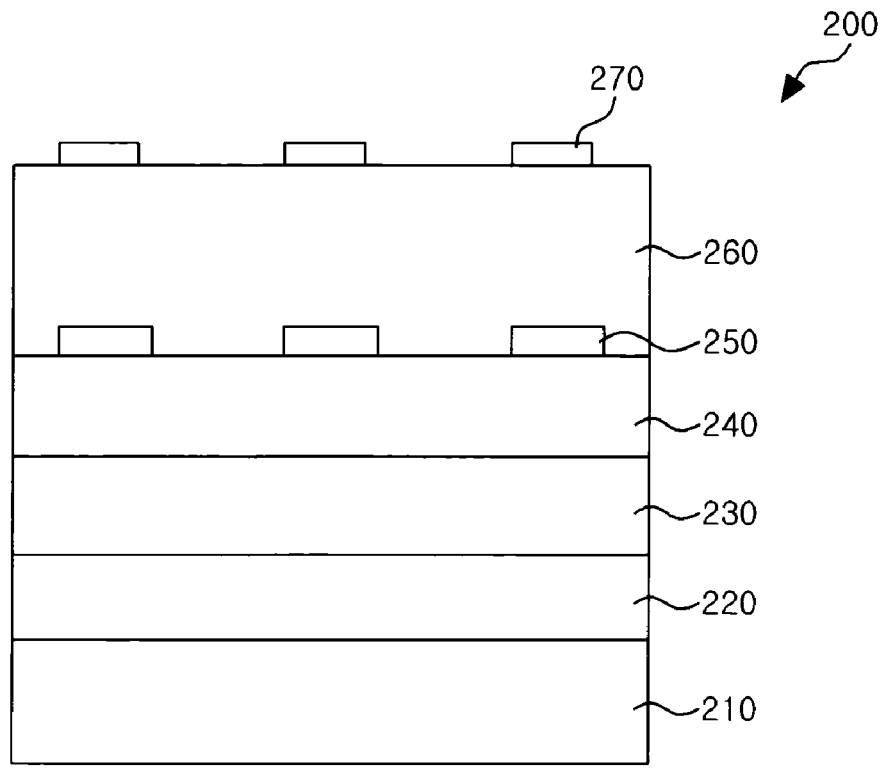
[FIG 31]
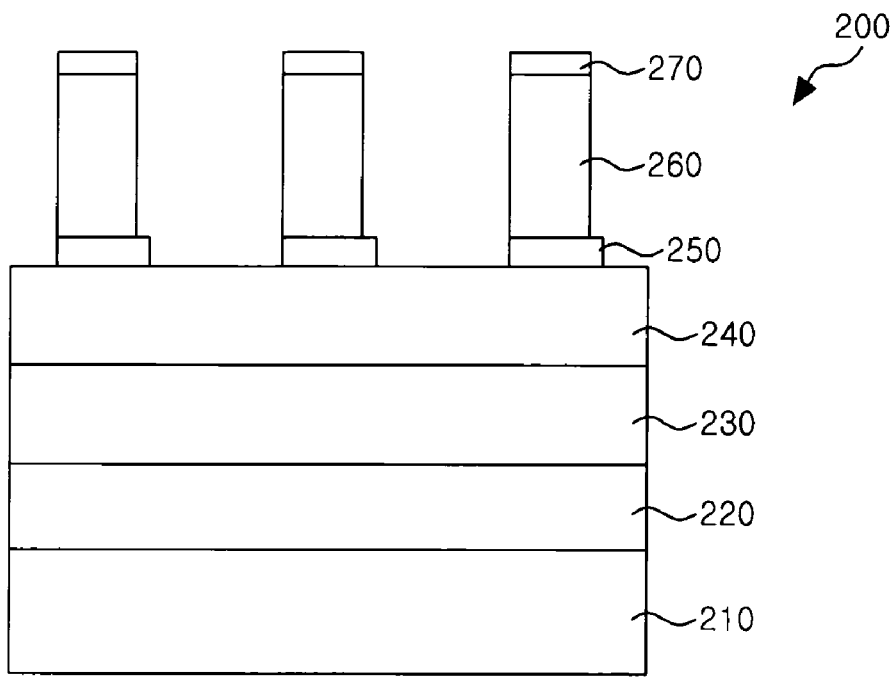

[FIG 32]
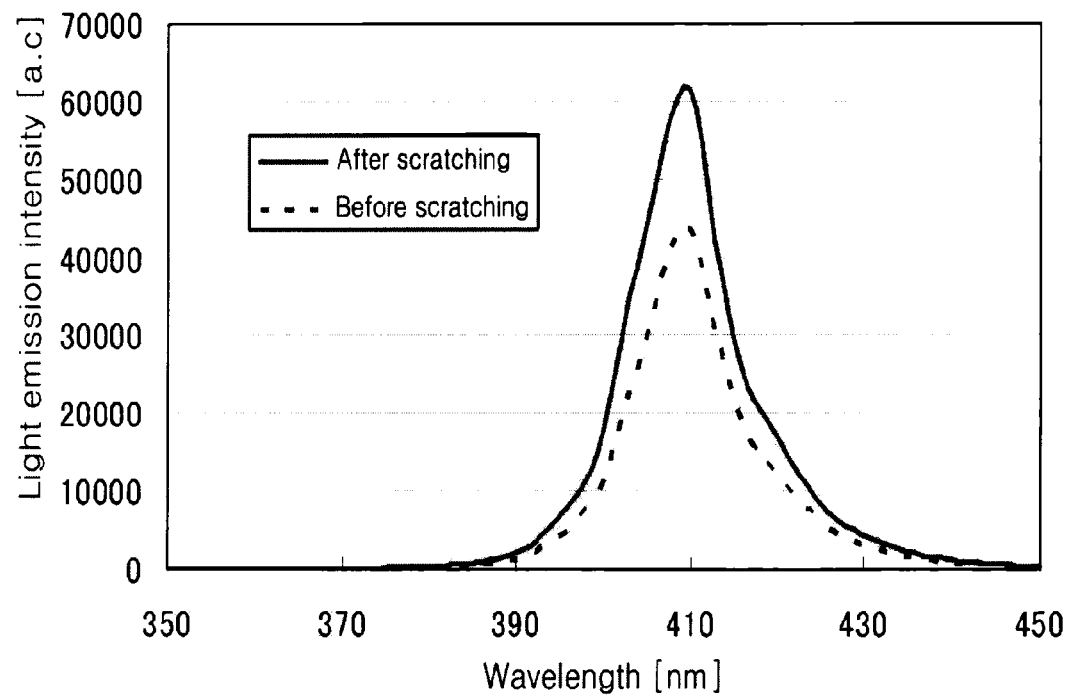
[FIG 33]
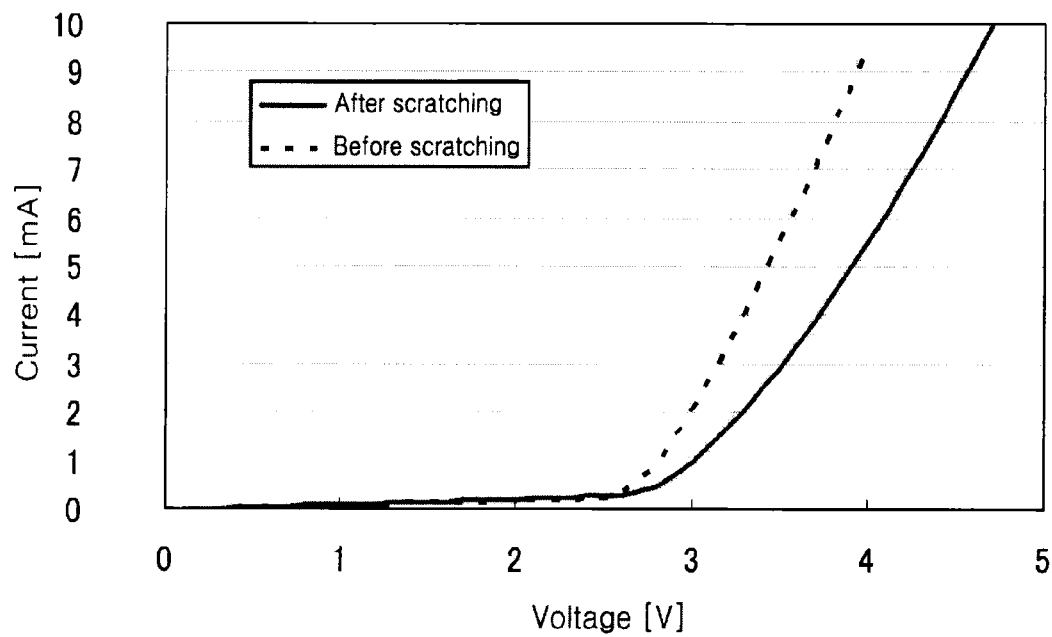

[FIG 34]
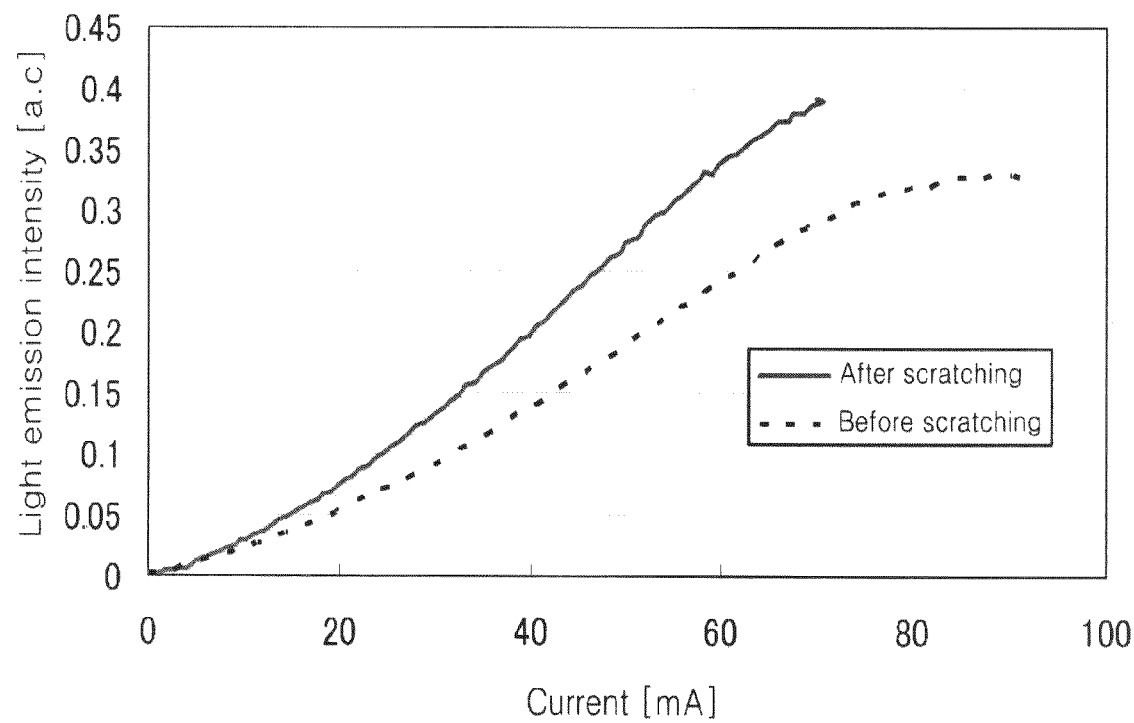
[FIG 35]
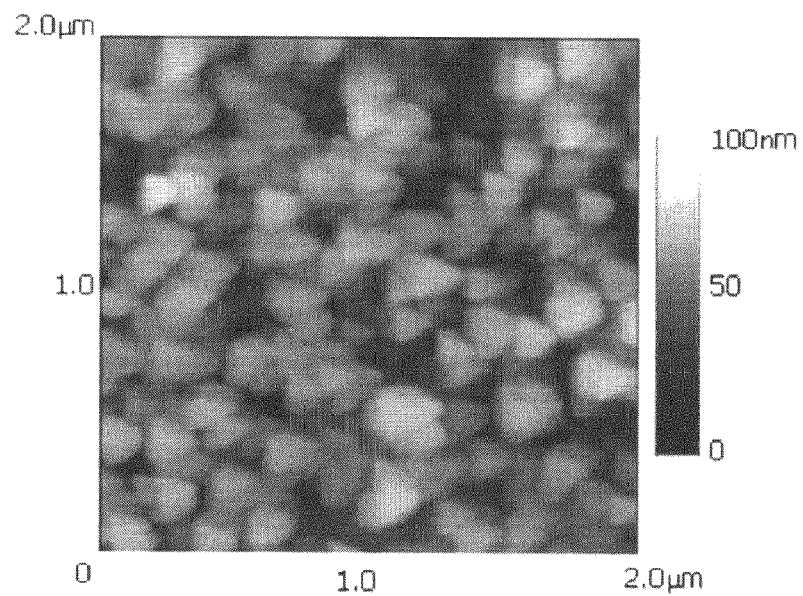

[FIG 36]
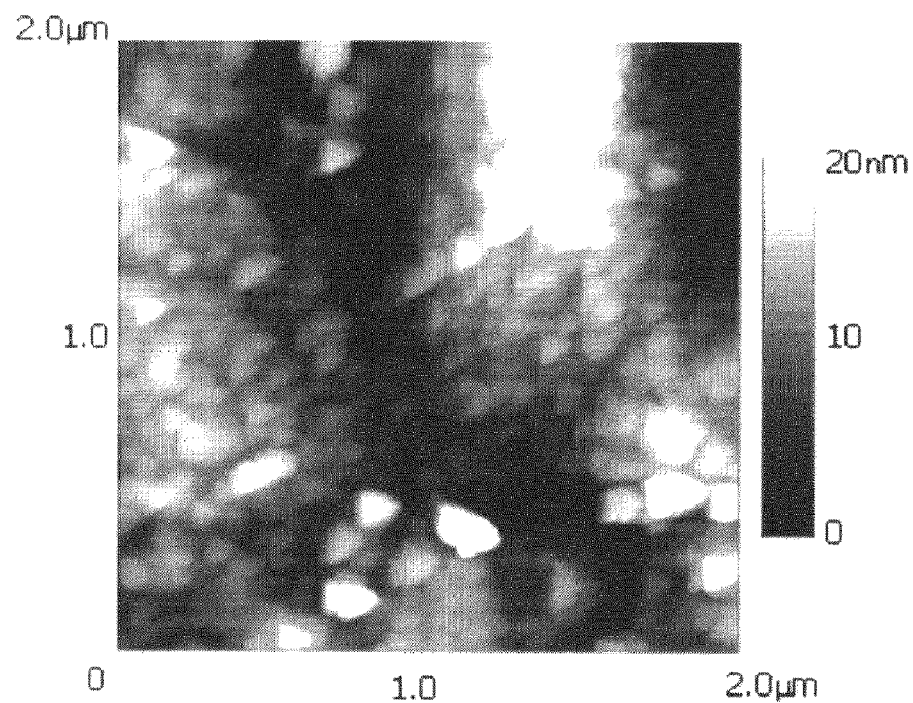
[FIG 37]
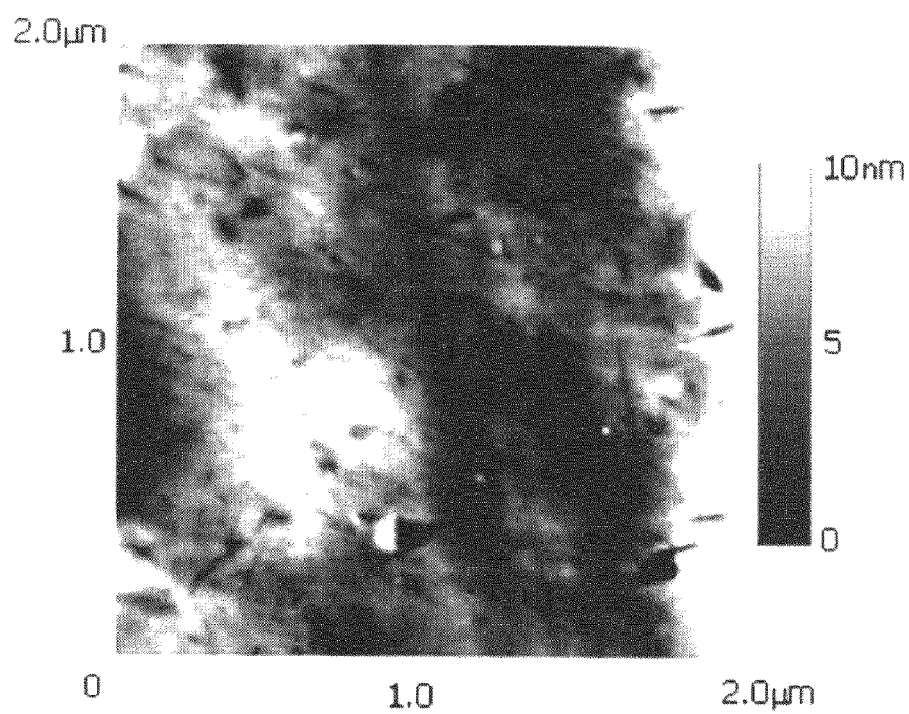

[FIG 38]
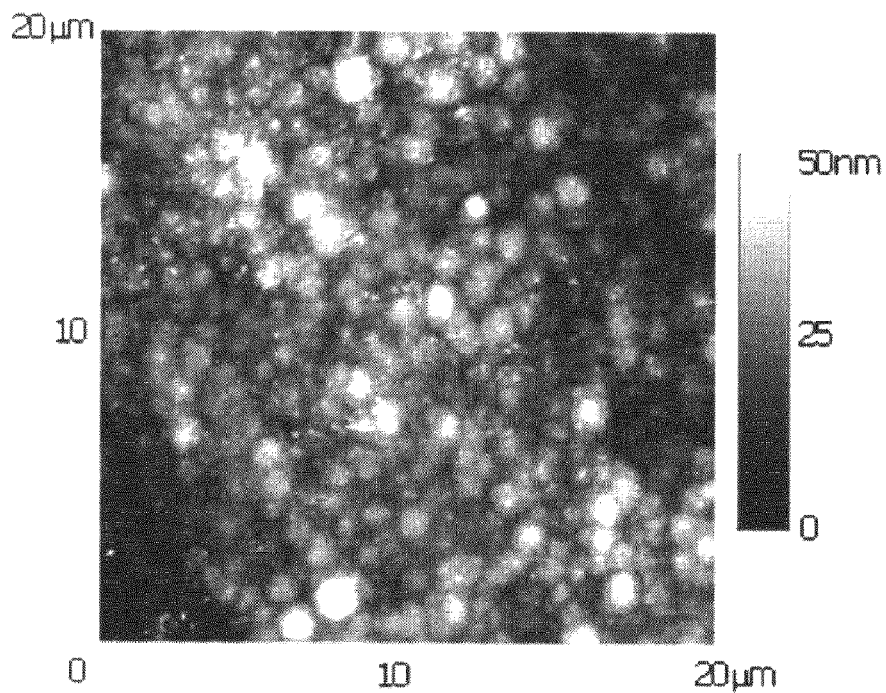
[FIG 39]
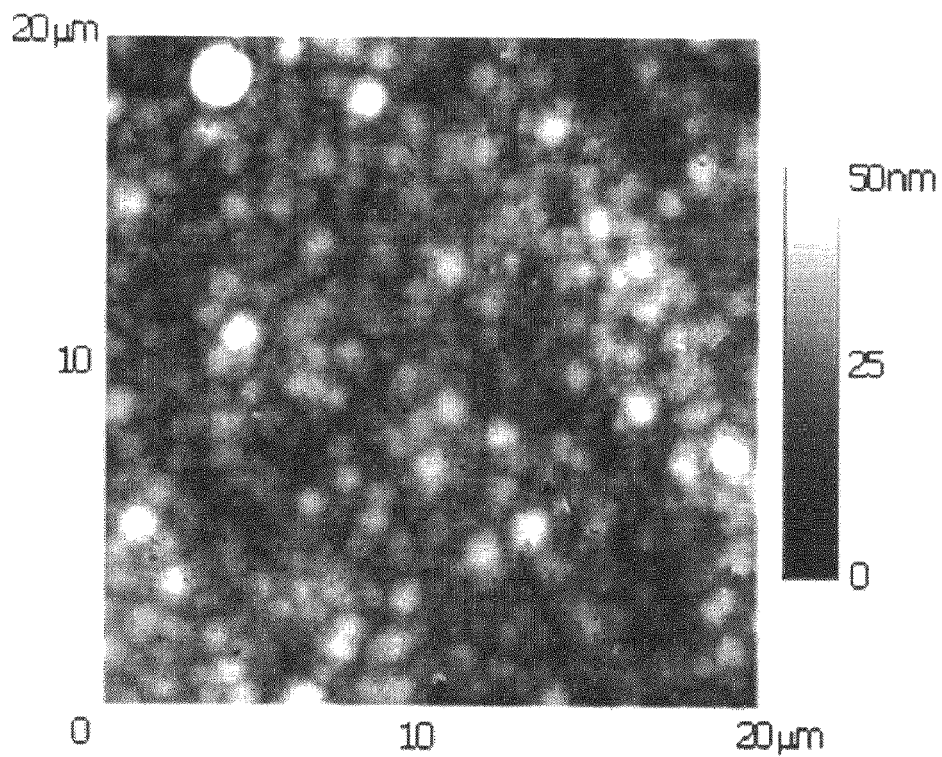

[FIG 40]
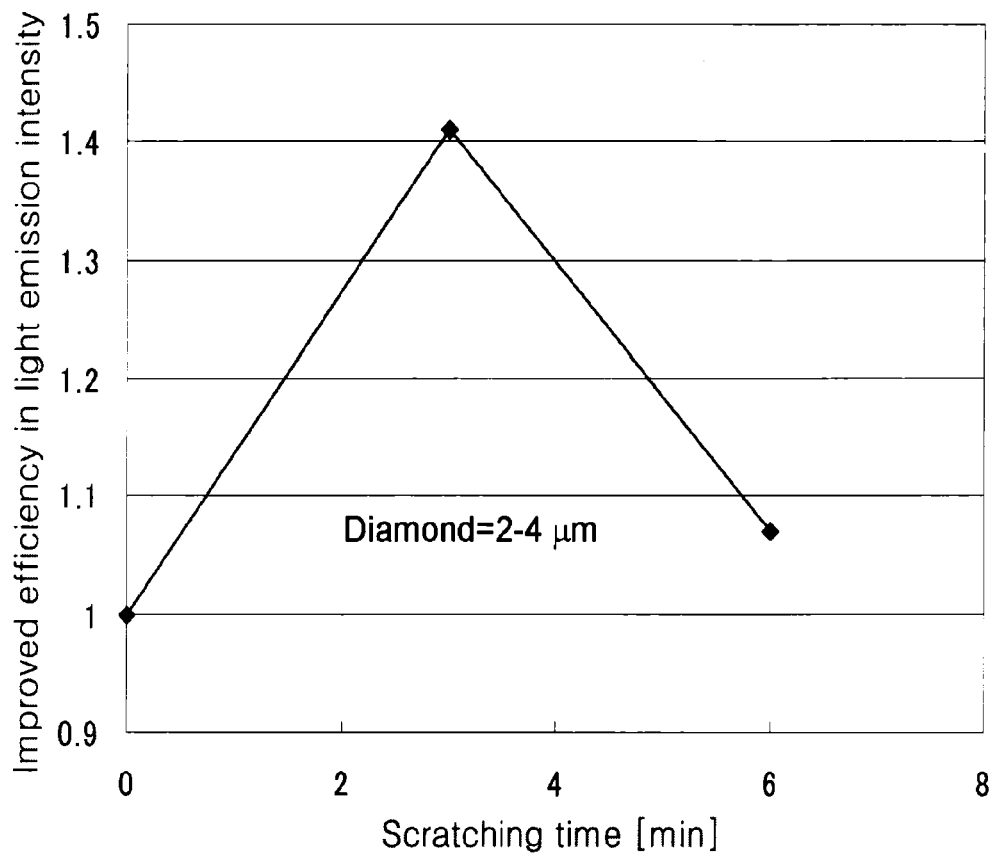
[FIG 41]
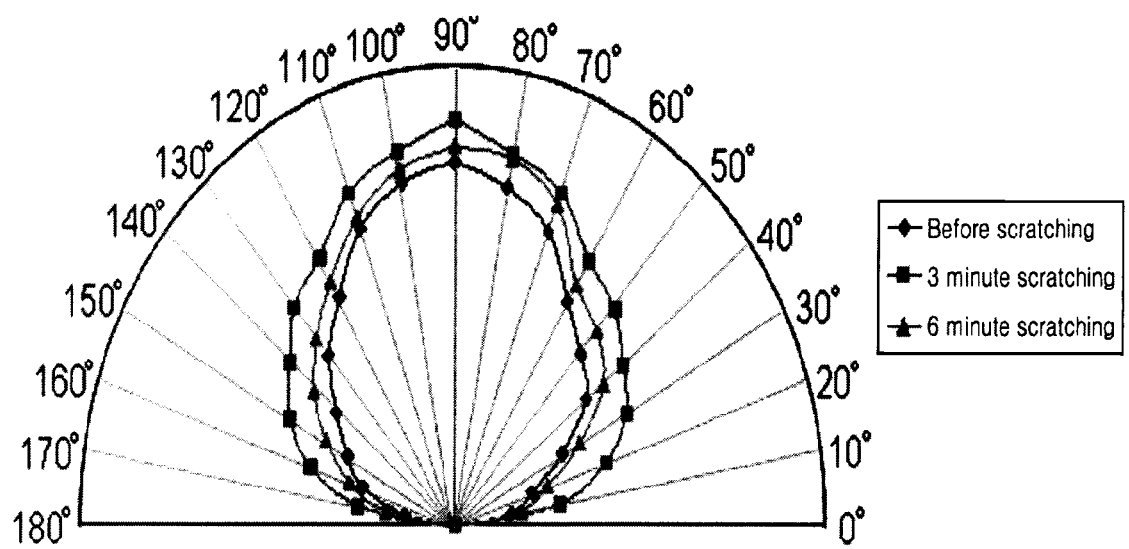

[FIG 42]
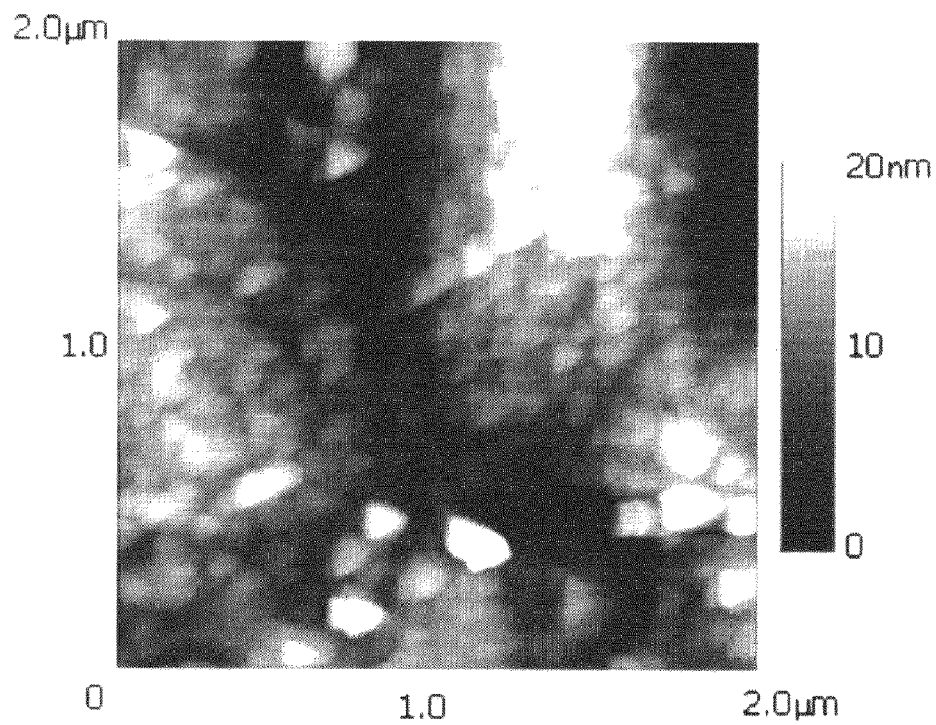
[FIG 43]
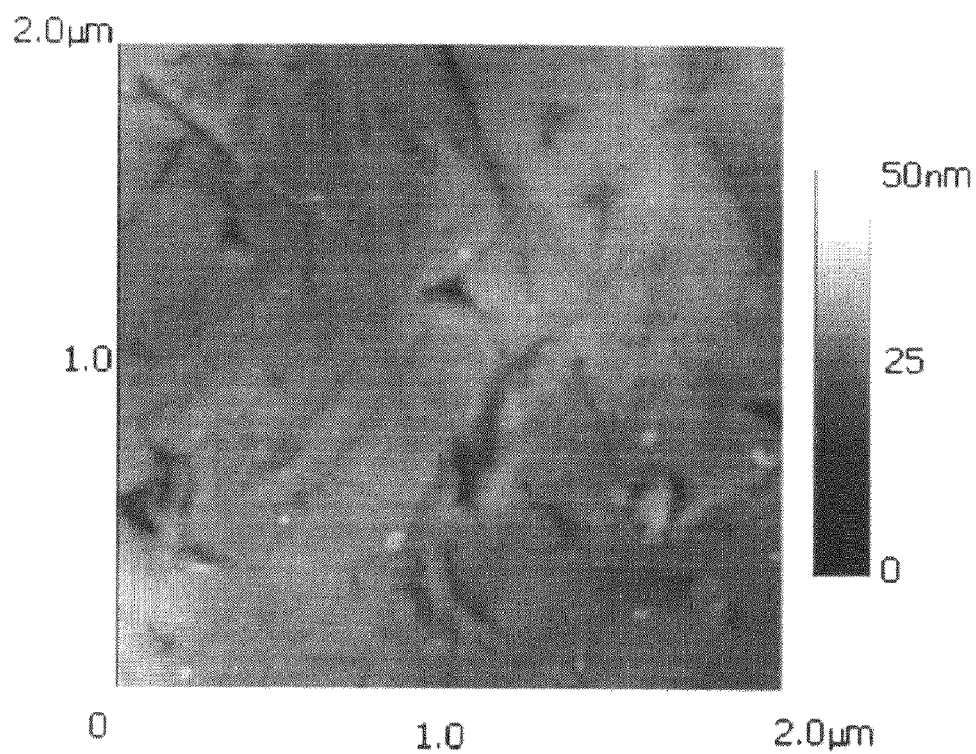

[FIG 44]
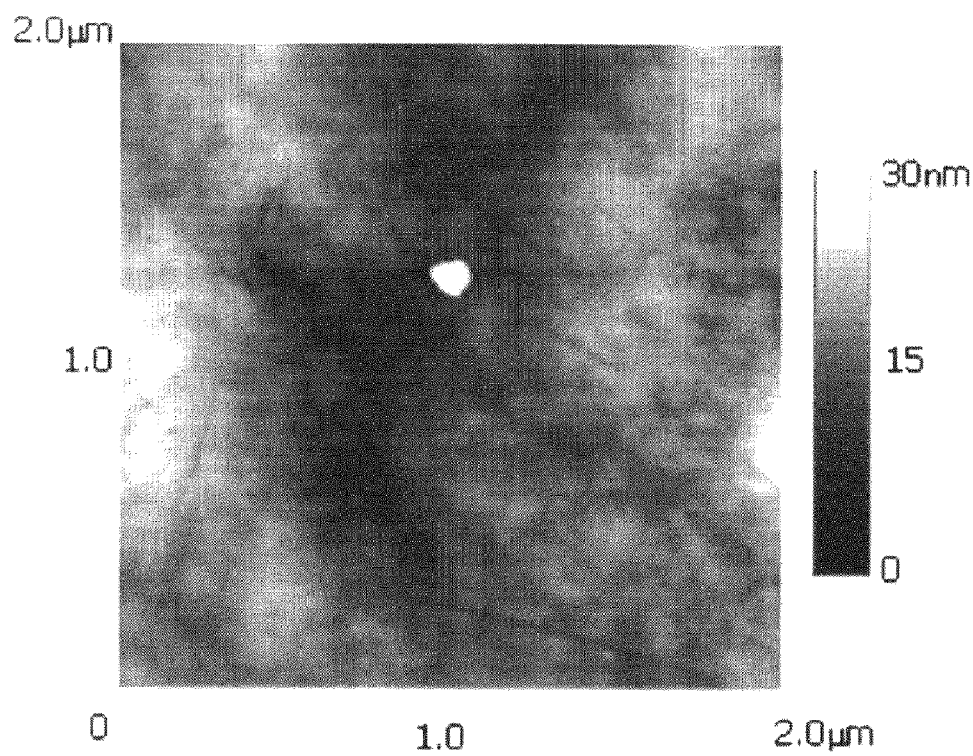
[FIG 45]
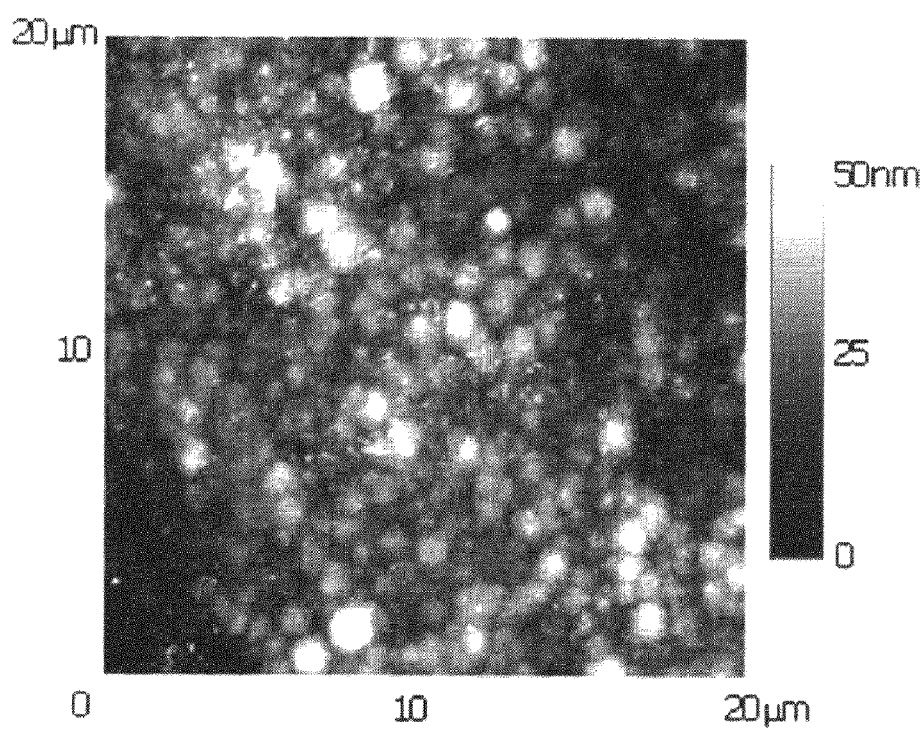

[FIG 46]
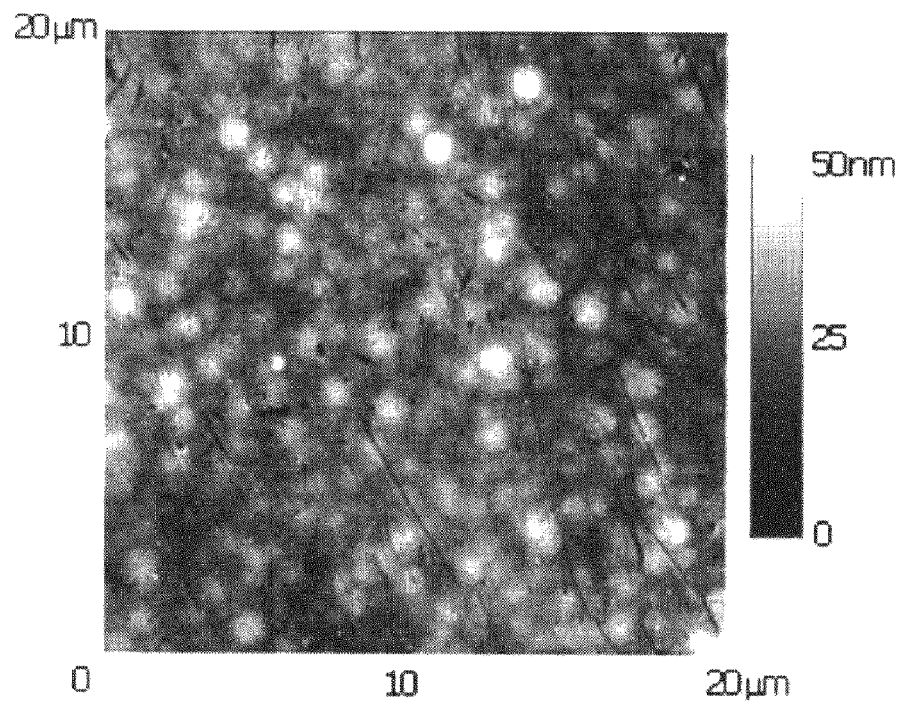
[FIG 47]
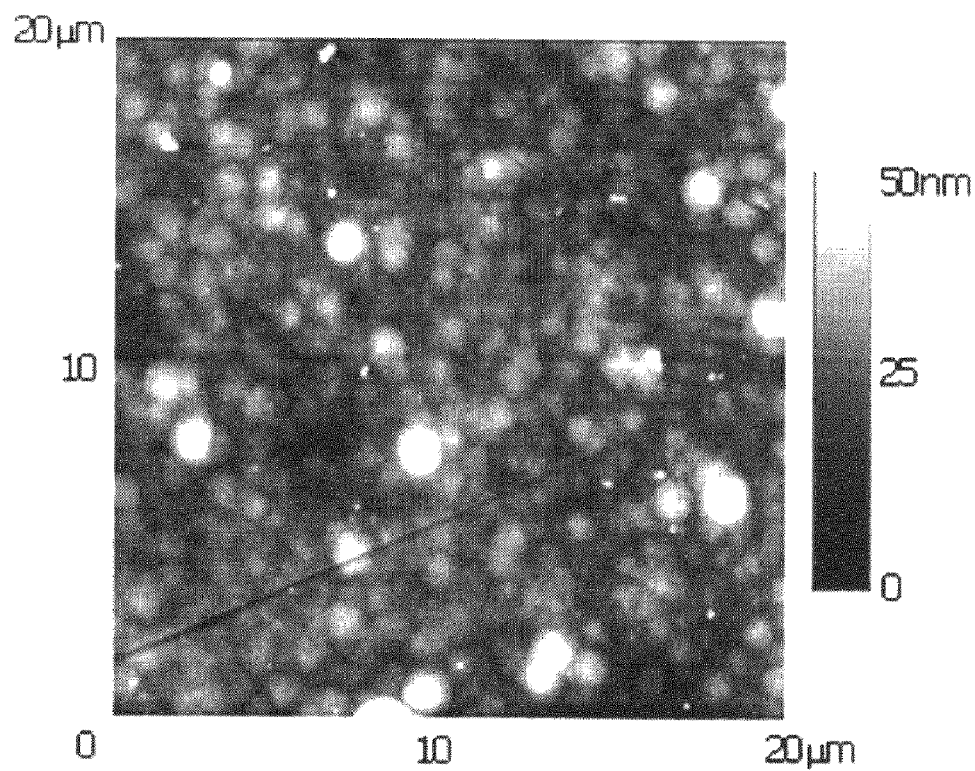

[FIG 48]
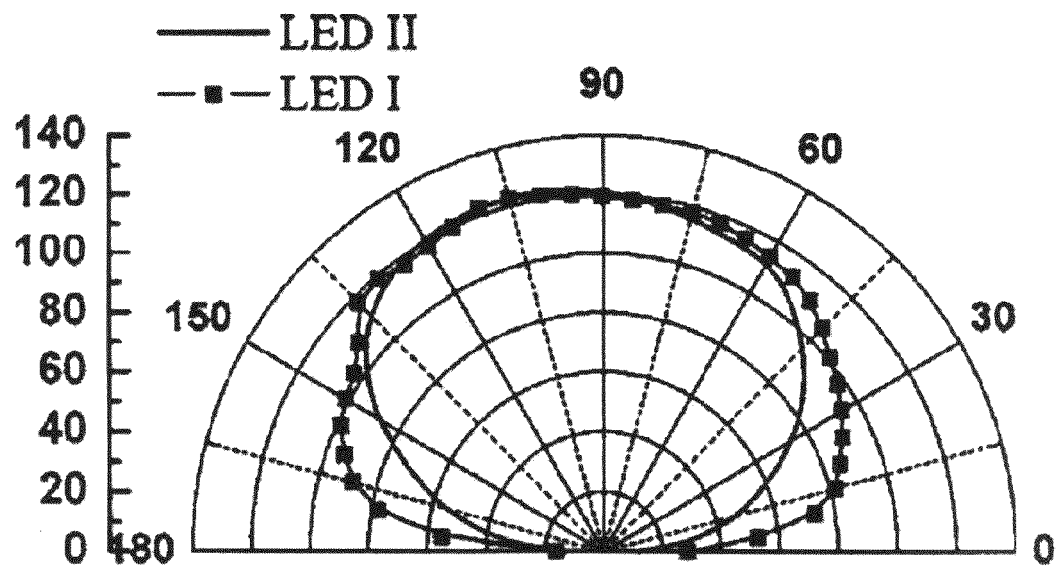
[FIG 49]
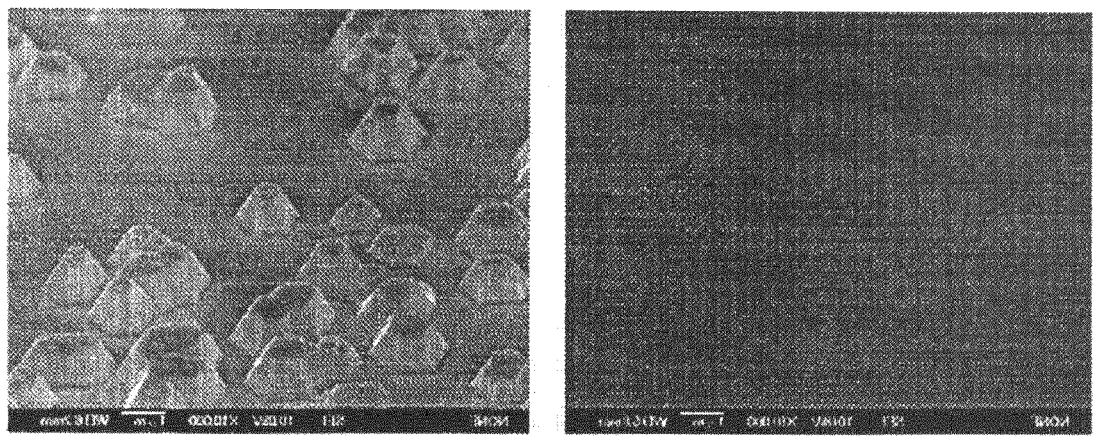

LIGHT EMITTING DIODE AND METHOD OF FABRICATING THE SAME

CROSS-REFERENCE TO RELATED APPLICATIONS

This application is the National Stage of International Application No. PCT/KR2008/002726, filed May 16, 2008, and claims priority from and the benefit of Korean Patent Application No. 10-2007-0049848, filed on May 22, 2007, which are both hereby incorporated by reference for all purposes as if fully set forth herein.

BACKGROUND OF THE INVENTION

1. Field of the Invention

The present invention relates to a light emitting diode and a method of fabricating the same, and more particularly, to a light emitting diode and a method of fabricating the same, wherein the light extraction efficiency is improved by scratching a surface of the light emitting diode by an abrasive using an ultrasonic cleaning apparatus.

2. Discussion of the Background

A light emitting diode (LED), as a representative light emitting device, is a photoelectric conversion semiconductor device having a structure, in which N-type semiconductor and P-type semiconductor are coupled with each other, and is configured to emit light through recombination of electrons and holes.

GaN based light emitting diode has been well known as the aforementioned light emitting diode. The GaN based light emitting diode is fabricated by sequentially laminating a GaN based N-type semiconductor layer, an active layer (or light emitting layer) and a P-type semiconductor layer on a substrate made of a material such as sapphire or SiC.

Recently, light emitting diodes with high efficiency have been expected to replace fluorescent lamps, and more particularly, the efficiency of a white light emitting diode is approaching a level similar to the efficiency of a conventional fluorescent lamp. However, there is room for improving the efficiency of the light emitting diode, and therefore, continuous improvement in efficiency has been more required.

In order to improve the efficiency of the light emitting diode, two principal approaches have been attempted. First, there is an approach for increasing an internal quantum efficiency which is determined depending on crystal quality and epitaxial-layered structure, and the second approach is to increase the light extraction efficiency as all the light generated from the light emitting diode does not totally exit to the outside and a large amount of light is internally lost.

SUMMARY OF THE INVENTION

The present invention is conceived from such requirements. An object of the present invention is to improve the light extraction efficiency of a light emitting diode by scratching a surface of the light emitting diode by an abrasive using an ultrasonic cleaning apparatus.

According to an aspect of the present invention for achieving the object, there is provided a method of fabricating a light emitting diode, which comprises the steps of forming a compound semiconductor layer on a substrate, the compound semiconductor layer including a lower semiconductor layer, an active layer and an upper semiconductor layer; and scratching a surface of the substrate by rubbing the substrate with an abrasive.

The method may further comprise the step of forming an electron wax layer on the upper semiconductor layer before the scratching step is performed.

The scratching step includes the steps of preparing a solvent having the abrasive mixed therein in an ultrasonic cleaning apparatus; positioning the substrate having the compound semiconductor layer formed thereon in the ultrasonic cleaning apparatus; and applying ultrasonic waves in the ultrasonic cleaning apparatus to perform the scratching through activation of the abrasive.

In the step of positioning the substrate, the substrate is preferably positioned to face downward in the ultrasonic cleaning apparatus.

The method may be performed using diamond having a diameter of 1 to 20 μm as the abrasive.

It is preferable that the diamond have a diameter of 2 to 4 μm.

The method may be performed using SiC having a diameter of 0.1 to 11.5 μm as the abrasive.

It is preferable that the SiC have a diameter of 0.1 to 3 μm.

The abrasive may include at least one of diamond, SiC, cBN (cubic boron nitride) and DLC (diamond like carbon).

The method may further comprise the steps of forming at least one electrode on the compound semiconductor layer; forming an insulation layer on the electrode; and scratching a surface of the insulation layer by rubbing the insulation layer with the abrasive.

According to another aspect of the present invention for achieving the object, there is provided a method of fabricating a light emitting diode, which comprises the steps of forming a compound semiconductor layer on a substrate, the compound semiconductor layer including a lower semiconductor layer, an active layer and an upper semiconductor layer; forming at least one electrode on the compound semiconductor layer; forming an insulation layer on the electrode; and scratching a surface of the insulation layer by rubbing the insulation layer with an abrasive.

The abrasive may include at least one of diamond, SiC, cBN (cubic boron nitride), and DLC (diamond like carbon).

The scratching step may include the steps of preparing a solvent having the abrasive mixed therein in an ultrasonic cleaning apparatus; positioning the substrate having the insulation layer formed thereon in the ultrasonic cleaning apparatus; and applying ultrasonic waves in the ultrasonic cleaning apparatus to scratch the insulation layer through activation of the abrasive.

In the step of positioning the substrate, the substrate may be positioned so that the insulation layer faces downward in the ultrasonic cleaning apparatus.

The step of forming an insulation layer may include the steps of forming the insulation layer on the compound semiconductor layer having the at least electrode formed thereon; and performing a patterning process for maintaining a portion of the insulation layer which is formed on the electrode and removing the other portion of the insulation layer, wherein the electrode is patterned so that a portion thereof is exposed. The insulation layer may include any one of $SiO_2$, $SiN_x$, $SiO_x$, $SiO_xN_y$, $InSnO_x$, and $BaTiO_x$.

The method may be performed using diamond having a diameter of 2 to 4 μm as the abrasive. It is preferable that the application time of the ultrasonic wave range from 2 to 4 minutes.

According to still another aspect of the present invention for achieving the object, there is provided a light emitting diode, which comprises a substrate; and a compound semiconductor layer including a lower semiconductor layer, an active layer and an upper semiconductor layer formed on the substrate, wherein the substrate has a surface irregularly scratched.

The light emitting diode may further comprise at least one electrode formed on the compound semiconductor layer; and an insulation layer formed on the electrode, wherein the insulation layer has a surface irregularly scratched.

According to still another aspect of the present invention for achieving the object, there is provided a light emitting diode, which comprises a substrate; a compound semiconductor layer including a lower semiconductor layer, an active layer and an upper semiconductor layer formed on the substrate; at least one electrode formed on the compound semiconductor layer; and an insulation layer formed on the electrode, wherein the insulation layer has a surface irregularly scratched. The insulation layer may include any one of $SiO_2$, $SiN_x$, $SiO_x$, $SiO_xN_y$, $InSnO_x$, and $BaTiO_x$. The scratched surface of the insulation layer may be formed with uneven portions, each of which is sized to be larger than 0 nm and equal to or smaller than 100 nm.

According to embodiments of the present invention, an ultrasonic cleaning apparatus and an abrasive are used to rub a surface of a light emitting diode to be scratched, so that light emitted from an active layer can effectively exit to the outside. Therefore, the light extraction efficiency of the light emitting diode can be improved.

When a surface of a sapphire substrate is scratched, the light emission intensity has been successfully improved up to 35% maximally. Since an uneven portion in a diffraction range after the scratching is reduced to be flat as compared with before the scratching, the light extraction efficiency for the light propagated toward the substrate has been reduced. Further, since the light emitted from an active layer collides with the uneven portion of the substrate and is reflected toward an upper surface of the light emitting diode, the light emission intensity at an upper portion of the light emitting diode is improved.

Further, when a surface of an $SiO_2$ insulation layer formed on a transparent electrode is scratched, the light emission intensity has been successfully improved up to 40% maximally. After the scratching, a plurality of uneven portions sized in a range from 0 to 50 nm or so are formed and thus cause Rayleigh scattering to occur. Accordingly, the light extraction efficiency in the surface is improved, so that the light emitted from the active layer can effectively exit, thereby improving the light emission intensity at an upper side of the light emitting diode.

BRIEF DESCRIPTION OF THE DRAWINGS

FIG. 1 is a sectional view illustrating a method of fabricating a light emitting diode having a substrate scratched according to an embodiment of the present invention.

FIG. 2 is a flowchart showing a method of fabricating a light emitting diode according to an embodiment of the present invention.

FIG. 3 is a sectional view of the light emitting diode illustrating the fabrication method of FIG. 2.

FIG. 4 is a schematic view of an ultrasonic cleaning apparatus for performing the fabrication method of FIG. 2.

FIG. 5 is a graph showing electroluminescence (EL) characteristics before and after scratching.

FIG. 6 is a graph showing current-voltage (IV) characteristics before and after the scratching.

FIG. 7 is an AFM photograph (in 2 μm range) of a sapphire substrate before the scratching is performed.

FIG. 8 is an AFM photograph (in 2 μm range) of a sapphire substrate after the scratching is performed.

FIG. 9 is an AFM photograph (in 20 μm range) of a sapphire substrate before the scratching is performed.

FIG. 10 is an AFM photograph (in 20 μm range) of a sapphire substrate after the scratching is performed.

FIG. 11 is a graph illustrating the relationship between particle size of an abrasive and the light emission intensity.

FIG. 12 is a graph showing EL characteristics before and after the scratching is performed using SiC (0.25 μm) for 120 minutes.

FIG. 13 is a graph showing EL characteristics before and after the scratching is performed using SiC (3 μm) for 120 minutes.

FIG. 14 is a graph showing EL characteristics before and after the scratching is performed using SiC (11.5 μm) for 120 minutes.

FIG. 15 is a graph in which experimental results are summarized according to particles sizes (0.25 μm, 3 μm and 11.5 μm) with which the experiments have been performed under experimental conditions which have been illustrated with reference to FIGS. 12 to 14.

FIG. 16 is an AFM photograph (in 2 μm range) of a sapphire substrate before the scratching is performed using SiC (0.25 μm) for 120 minutes.

FIG. 17 is an AFM photograph (in 2 μm range) of a sapphire substrate after the scratching is performed using SiC (0.25 μm) for 120 minutes.

FIG. 18 is an AFM photograph (in 20 μm range) of a sapphire substrate before the scratching is performed using SiC (0.25 μm) for 120 minutes.

FIG. 19 is an AFM photograph (in 20 μm range) of a sapphire substrate after the scratching is performed using SiC (0.25 μm) for 120 minutes.

FIG. 20 is a graph showing EL characteristics before and after the scratching is performed using diamond (2 to 4 μm) for 10 minutes.

FIG. 21 is a graph showing EL characteristics before and after the scratching is performed using diamond (2 to 4 μm) for 60 minutes.

FIG. 22 is a graph showing EL characteristics before and after the scratching is performed using diamond (2 to 4 μm) for 120 minutes.

FIG. 23 is a graph illustrating the relationship between the scratching time and the light emission intensity.

FIG. 24 is a graph showing EL characteristics measured at an upper side of a light emitting diode before and after the scratching is performed using SiC (0.25 μm) for 150 minutes.

FIG. 25 is a graph showing IV characteristics before and after the scratching.

FIG. 26 is a graph showing IL characteristics before and after the scratching.

FIG. 27 is a graph showing IL characteristics at a substrate side before and after the scratching.

FIG. 28 is a sectional view illustrating a method of fabricating a light emitting diode, in which an insulation layer formed on an electrode is scratched, according to another embodiment of the present invention.

FIG. 29 is a flowchart of the fabricating method of the light emitting diode shown in FIG. 28.

FIGS. 30 and 31 are views illustrating the fabricating method of FIG. 29.

FIG. 32 is a graph showing EL characteristics before and after the scratching.

FIG. 33 is a graph showing IV characteristics before and after the scratching.

FIG. 34 is a graph showing IL characteristics before and after the scratching.

FIG. 35 is an AFM photograph of a transparent electrode in 2 μm range.

FIG. 36 is an AFM photograph (in 2 μm range) of an insulation layer before the scratching is performed.

FIG. 37 is an AFM photograph (in 2 μm range) of an insulation layer after the scratching is performed.

FIG. 38 is an AFM photograph (in 20 μm range) of a surface of an insulation layer before the scratching is performed.

FIG. 39 is an AFM photograph (in 20 μm range) of a surface of an insulation layer after the scratching is performed.

FIG. 40 is a graph illustrating the relationship between the scratching time and the light emission intensity.

FIG. 41 is a graph illustrating angular distribution characteristics of the light emission intensity before and after the scratching.

FIG. 42 is an AFM photograph (in 2 μm range) of an insulation layer before the scratching is performed.

FIG. 43 is an AFM photograph (in 2 μm range) of an insulation layer after the scratching is performed for 3 minutes.

FIG. 44 is an AFM photograph (in 2 μm range) of an insulation layer after the scratching is performed for 6 minutes.

FIG. 45 is an AFM photograph (in 20 μm range) of an insulation layer before the scratching is performed.

FIG. 46 is an AFM photograph (in 20 μm range) of an insulation layer after the scratching is performed for 3 minutes.

FIG. 47 is an AFM photograph (in 20 μm range) of an insulation layer after the scratching is performed for 6 minutes.

FIG. 48 is a graph showing light emission angle characteristics of a light emitting diode according to a comparative example.

FIG. 49 is a photograph showing a surface of the light emitting diode according to the comparative example.

DETAILED DESCRIPTION OF THE ILLUSTRATED EMBODIMENTS

Hereinafter, embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

First, optical principles related to light extraction efficiency in a light emitting diode will be described. When scratching is performed, various embodiments of the present invention make it possible to improve the light extraction efficiency through such optical principles.

1. Refraction of Light (Snell's Law)

When light passes through two materials whose refractive indexes are different from each other, the light is refracted as follows:

$$\frac{\sin\theta_A}{\sin\theta_B} = \frac{n_B}{n_A}$$

where $n_A$ is an absolute refractive index of a material A and $n_B$ is an absolute refractive index of a material B.

Further, when the light is incident at an angle equal to or more than a predetermined angle, i.e., a threshold angle, then total reflection occurs. The threshold angle for total reflection is represented as follows:

$$\sin\theta_m = \frac{\sin\theta_m}{\sin 90°} = \frac{n_B}{n_A}$$

When the light extraction is discussed with the Snell's law, the deeper is an uneven portion of a surface, the more improved is the light extraction efficiency. However, if this uneven portion is sized to be smaller than the light emission wavelength of the light to be emitted, the light is not influenced by the uneven portion, so that a phenomenon such as refraction and reflection may not occur. That is, if the uneven portion may be configured to have depth equal to or larger than the light emission wavelength through the scratching, the light extraction efficiency can be improved.

2. Scattering of Light (Rayleigh Scattering)

Rayleigh scattering is light scattering caused by particles sized smaller than a wavelength of light. Rayleigh scattering occurs not only generally in gas but also in transparent liquid or solid. Due to this scattering, the light which has been totally reflected exits to the outside, so that it can be expected to improve the light extraction efficiency. The amount of scattered light depends on the size of particles and the wavelength of light, and the scattering coefficient is inversely proportional to the forth power of the wavelength. The scattering coefficient Ks of Rayleigh scattering may be represented as follows:

$$k_s = \frac{2\pi^6}{3}n\left(\frac{m^2-1}{m^2+2}\right)^2\frac{d^5}{\lambda^4}$$

where n is a diameter of particles, d is the number of particles, and λ is a light emission wavelength.

That is, as the number of particles becomes larger and a light emission wavelength becomes shorter, the scattering occurs more actively. However, in order to generate Rayleigh scattering, the following condition is required.

$$\alpha = \frac{\pi D}{\lambda}$$

where πD is a diameter of particles, and λ is a light emission wavelength.

When α is equal to or smaller than 0.4, Rayleigh scattering may occur. When α is larger than 0.4, Mie scattering may occur. If each particle is not spherically shaped in the Mie scattering, there exists no scattering. Therefore, Mie scattering is inappropriate to the scratching according to the present invention. When the light emission wavelength is 400 nm, the largest diameter of particles required to make Rayleigh scattering occur is 50 nm. Accordingly, as the scratched uneven portion becomes larger (sized to be equal to or smaller than 50 nm), the number of uneven portions becomes larger, and a light emission wavelength becomes shorter, the light extraction efficiency is more improved.

FIG. 1 is a sectional view illustrating a method of fabricating a light emitting diode having a substrate scratched according to an embodiment of the present invention, showing a state where the substrate is scratched.

Referring to FIG. 1, a light emitting diode 100 according to the embodiment of the present invention has semiconductor layers 120, 130, and 140 positioned on a substrate 110. The substrate 110 may be an insulative or conductive substrate. The substrate 110 may be a substrate made of sapphire ($Al_2O_3$), SiC, ZnO, Si, GaAs, GaP, lithium alumina ($LiAl_2O_3$), BN, AlN, or GaN but is not be limited thereto. The substrate 110 may be selected variously depending on materials of the semiconductor layers to be formed on the substrate 110. Further, the substrate 110 may be a substrate having upper and/or lower surfaces patterned.

A lower surface of the substrate 110 has been scratched. The lower surface of the substrate 110 has been scratched using an ultrasonic cleaning apparatus and an abrasive, which will be described later.

The semiconductor layers 120, 130, and 140 includes a lower semiconductor layer 120, an upper semiconductor layer 140 positioned on top of the lower semiconductor layer 120, and an active layer 130 interposed between the lower semiconductor layer 120 and the upper semiconductor layer 140. Here, the lower and upper semiconductor layers 120 and 140 are made of n-type and p-type semiconductors, or p-type and n-type semiconductors, respectively.

The lower semiconductor layer 120, the active layer 130 and the upper semiconductor layer 140 may be made of gallium nitride based semiconductor materials, i.e., (B, Al, In, Ga)N. Composition elements and a composition ratio of the active layer 130 are determined so that light having a wavelength to be required, e.g., ultraviolet ray or blue light is emitted. The lower semiconductor layer 120 and the upper semiconductor layer 140 are made of a material having a bandgap larger than that of the active layer 130.

The lower semiconductor layer 120 and/or the upper semiconductor layer 140 may be formed to have a single-layered or multi-layered structure, as shown in the figure. Further, the active layer 130 may have a single quantum well structure or a multiple quantum well structure.

Meanwhile, a buffer layer (not shown) may be interposed between the semiconductor layers 120, 130, and 140 and the substrate 110. The buffer layer is employed in order to alleviate the lattice mismatch between the substrate 110 and the lower semiconductor layer 120 to be formed thereon.

Further, transparent electrodes 150 are formed on the upper semiconductor layer 140. The transparent electrode 150 allows light generated from the active layer 130 to be transmitted and allow current to be dispersedly supplied to the upper semiconductor layer 140. Meanwhile, electrode pads may be formed on the transparent electrode 150, and wires (not shown) are bonded to the electrode pads. In the meantime, electrode pads (not shown) may be formed on the lower semiconductor layer 120. The electrode pads are in ohmic contact with the lower semiconductor layer 120. In addition, wires (not shown) may be in contact with the electrode pads to be electrically connected to the lower semiconductor layer 120.

The lower surface of the substrate 110 is formed to have a rough surface, so that the light emitted form the active layer 130 and propagated toward the substrate 110 may be reflected from the rough surface, thereby effectively exiting through the upper semiconductor layer 140.

FIG. 2 is a flowchart showing a method of fabricating a light emitting diode according to a preferred embodiment of the present invention, and FIG. 3 and FIG. 4 are views illustrating the fabricating method.

Referring to FIG. 2 and FIG. 3, the substrate 110 is prepared (S1). The substrate 110 may be, for example, a sapphire substrate or a SiC substrate.

Then, the lower semiconductor layer 120, the active layer 130 and the upper semiconductor layer 140 are formed on the substrate 110 (S2). The transparent electrodes 150 are formed on the upper semiconductor layer 140 (S3). An electron wax layer 160 is formed on the upper semiconductor layer 140 on which the transparent electrodes 150 are formed (S4). The electron wax layer 160 serves to prevent the transparent electrode 150 and the upper semiconductor layer 140 from being scratched when scratching is performed later. In this way, the light emitting diode 100 which is not yet scratched is completed.

An abrasive is prepared (S5). The abrasive is made of any one of diamond, SiC, cubic boron nitride (cBN), diamond like carbon (DLC), and a mixture thereof, which are materials having Mohs' hardness equal to or larger than that of sapphire, i.e., 9. The prepared abrasive is prepared to be mixed into a solvent. Methanol or ethanol may be used as the solvent.

An ultrasonic cleaning apparatus 300 is prepared (S6). As shown in FIG. 4, any ultrasonic cleaning apparatus capable of generating ultrasonic waves in a sonic, ultrasonic, or megasonic region may be used as the ultrasonic cleaning apparatus 300.

A solvent 302 having an abrasive 301 mixed therein is put into the ultrasonic cleaning apparatus 300, the light emitting diode 100 to be scratched is positioned therein, and then, ultrasonic waves are generated to activate the abrasive 301 (S7). At this time, the substrate 110 to be scratched is positioned to face downward in the ultrasonic cleaning apparatus 300. Through the figures, reference numeral 303 designates a container, and reference numeral 304 designates water contained therein.

When the ultrasonic vibration is generated in the ultrasonic cleaning apparatus 300, the abrasive 301 is activated in the ultrasonic cleaning apparatus to rub the lower surface of the substrate 110. The rubbing with the abrasive 301 causes the lower surface of the substrate 110 to be irregularly worn away and to be roughly scratched as shown in FIG. 1.

The roughness and shape in the surface of the substrate 110 may be changed without limit depending on the particle size of the abrasive 301 and the ultrasonic wave generation time of the ultrasonic cleaning apparatus 300.

Then, the electron wax layer 160, which has been formed on the transparent electrodes 150 and the upper semiconductor layer 140, is removed, and the upper semiconductor layer 140 and the active layer 130 are partially etched out to partially expose the lower semiconductor layer 120. Other electrodes (not shown) are formed on the exposed lower semiconductor layer 120.

Then, through a diamond or laser scribing, the light emitting diode 100 is separated into individual light emitting diodes, which are completely fabricated.

Hereinafter, the improved characteristics of the light emitting diode according to the embodiment of the present invention will be shown through various experimental examples.

<Experiment 1>

The lower surface of the substrate of the light emitting diode was scratched using diamond as the abrasive, and then, it was measured how much the light emission intensity of the light emitting diode after the scratching is increased as compared with before the scratching.

[Experimental Condition]
LED: blue light (N1374)
Methanol: 10 cc
Diamond (size of 2 to 4 μm): 500 mg
Scratching time: 150 minutes
Frequency of ultrasonic cleaning apparatus: 28 KHz
[Experimental Result]

FIG. 5 is a graph showing electroluminescence (EL) characteristics before and after the scratching is performed while FIG. 6 is a graph showing current-voltage (IV) characteristics before and after the scratching is performed.

Referring to FIG. 5, it could be seen that the light emission intensity after the scratching was improved by about 30% as compared with before the scratching. In addition, the substantially identical results could be obtained from the same measurement to various patterns.

Meanwhile, referring to FIG. 6, it could be seen that IV characteristics are not changed before and after the scratching. Non-change of the IV characteristics before and after the scratching is because the electron wax layer is formed on the upper semiconductor layer and thus the upper semiconductor layer or the electrode is not damaged while the scratching is performed. After the electron wax layer was formed in order to perform the scratching, the electron wax layer was either maintained or removed when the IV characteristics were detected. It could be confirmed that the IV characteristics have not been changed regardless of maintaining or removing the electron wax layer.

Referring to FIG. 5, it could be seen that the light emission efficiency was increased through the scratching. In order to confirm which operation of the scratching causes the light emission efficiency to be improved, AFM photographs of the sapphire substrate before and after the scratching were compared with each other.

AFM photographs of a sapphire substrate are taken in two ranges. That is, in order to examine the distribution of the uneven portions which cause the light to be scattered, AFM photographs in 2 μm range were taken to be compared with each other. In addition, in order to examine the distribution of the uneven portions which cause the light to be refracted or reflected, AFM photographs in 20 μm range were taken to be compared with each other.

FIG. 7 is an AFM photograph (in 2 μm range) of a sapphire substrate before the scratching is performed while FIG. 8 is an AFM photograph (in 2 μm range) of a sapphire substrate after the scratching is performed.

When FIG. 7 and FIG. 8 are compared with each other, it can be seen that the surface of the sapphire substrate in 2 μm range is very smooth before the scratching as shown in FIG. 7, whereas the surface of the sapphire in 2 μm range has a plurality of uneven portions sized to be 0 to 100 nm after the scratching as shown in FIG. 8. In the uneven portions sized to be equal to or smaller than a light emission wavelength of 2 μm, neither a light refraction phenomenon nor a light reflection phenomenon occurs, whereas the light scattering phenomenon occurs. Accordingly, it was confirmed that the scratching causes the scattering to occur more actively and therefore the light extraction efficiency of light exiting through the substrate could be increased.

FIG. 9 is an AFM photograph (in 20 μm range) of a sapphire substrate before the scratching is performed while FIG. 10 is an AFM photograph (in 20 μm range) of a sapphire substrate after the scratching is performed.

The uneven portions in 20 μm range cause the light to be refracted and reflected. When FIG. 9 and FIG. 10 are compared with each other, the surface of the sapphire substrate in 20 μm range is rough as shown in FIG. 9 which is photographed before the scratching, whereas the number of uneven portions in the surface of the sapphire in 20 μm range is rather smaller and therefore the surface of the sapphire is flat as shown in FIG. 10 which is photographed after the scratching.

According to Snell's law, as each uneven portion in the surface becomes deeper, the light extraction efficiency is more improved. Accordingly, the AFM photographs of the sapphire substrate in 20 μm range show that the surface of the sapphire substrate which was rough before the scratching is worn away through the scratching to become rather flat, whereby the light extraction efficiency of light exiting through the substrate may be reduced due to the light refraction and the light reflection.

FIG. 11 is a graph illustrating the relationship between particle size of an abrasive and the light emission intensity, wherein the improved efficiency in the light emission intensity are summarized according to particle sizes (0.2 μm, 4 μm and 20 μm) of diamond. From such results, it can be seen that the light emission intensity is largely improved when the particle size of diamond used as the abrasive ranges from 2 to 4 μm.

<Experiment 2>

The lower surface of the substrate in the light emitting diode was scratched using SiC as the abrasive, and then it was measured how much the light emission intensity after the scratching is increased as compared with before the scratching.

[Experimental Condition]
LED: blue light (N1371)
Methanol: 20 cc
SiC (size of 0.25 μm, 3 μm and 11.5 μm): 1 g
Scratching time: 120 minutes
Frequency of ultrasonic cleaning apparatus: 28 KHz
[Experimental Result]

FIG. 12 is a graph showing EL characteristics before and after the scratching is performed using SiC (0.25 μm) for 120 minutes.

Referring to FIG. 12, it could be seen that the light emission intensity after the scratching was improved by about 30% as compared with before the scratching.

FIG. 13 is a graph showing EL characteristics before and after the scratching is performed using SiC (3 μm) for 120 minutes.

Referring to FIG. 13, it can be seen that the light emission intensity after the scratching is more or less improved as compared with before the scratching, but the light emission intensity is little changed.

FIG. 14 is a graph showing EL characteristics before and after the scratching is performed using SiC (11.5 μm) for 120 minutes.

Referring to FIG. 14, there is no change in light emission intensity before and after the scratching. FIG. 15 is a graph in which experimental results are summarized according to particles sizes (0.25 μm, 3 μm and 11.5 μm) with which the experiments have been performed under experimental conditions which have been illustrated with reference to FIG. 12, FIG. 13, and FIG. 14. From the above results, it can be seen that as the particle size of SiC used as the abrasive is smaller, the light emission intensity is more improved.

FIG. 16 is an AFM photograph (in 2 μm range) of a sapphire substrate before the scratching is performed using SiC (0.25 μm) for 120 minutes, and FIG. 17 is an AFM photograph (in 2 μm range) of a sapphire substrate after the scratching is performed using SiC (0.25 μm) for 120 minutes.

When FIG. 16 and FIG. 17 are compared with each other, it can be seen that the surface of the sapphire substrate in 2 μm range is very smooth before the scratching as shown in FIG. 16, whereas the surface of the sapphire in 2 μm range has a plurality of uneven portions sized to be 100 to 200 nm after the scratching as shown in FIG. 17. In the uneven portions sized to be equal to or smaller than the light emission wavelength in 2 μm range, the light scattering phenomenon does not occur but the light refraction phenomenon occurs. However, this scratching angle is so shallow that it is difficult to improve the light emission intensity. That is, in the scratched uneven portions, the light extraction efficiency of light exiting to the outside through the substrate is not improved.

FIG. 18 is an AFM photograph (in 20 μm range) of a sapphire substrate before the scratching is performed using SiC (0.25 μm) for 120 minutes, and FIG. 19 is an AFM photograph (in 20 μm range) of a sapphire substrate after the scratching is performed using SiC (0.25 μm) for 120 minutes.

When FIG. 18 and FIG. 19 are compared with each other, the surface of the sapphire substrate in 20 μm range is rough as shown in FIG. 18 which is photographed before the scratching, whereas the number of uneven portions in the surface of the sapphire in 20 μm range is rather smaller and therefore the surface of the sapphire is flat as shown in FIG. 19 which is photographed after the scratching.

According to Snell's law, as each uneven portion in the surface becomes deeper, the light extraction efficiency is more improved. Accordingly, the AFM photographs of the sapphire substrate in 20 μm range show that the surface of the sapphire substrate which was rough before the scratching is worn away through the scratching to become rather flat, whereby the light extraction efficiency of light exiting through the substrate may be reduced due to the light refraction and the light reflection.

<Experiment 3>

In Experiment 3, when the lower surface of the substrate in the light emitting diode was scratched using diamond as the abrasive, the relationship between the scratching time and the light emission intensity was measured.

[Experimental Condition]
LED: blue light (N1374)
Methanol: 10 cc
Diamond (size of 2 to 4 μm): 500 mg
Scratching time: 10 minutes, 60 minutes and 120 minutes
Frequency of ultrasonic cleaning apparatus: 28 KHz
[Experimental Result]

FIG. 20 is a graph showing EL characteristics before and after the scratching is performed using diamond (2 to 4 μm) for 10 minutes.

Referring to FIG. 20, there is little characteristic change in the light emission intensity before and after the scratching is performed for 10 minutes.

FIG. 21 is a graph showing EL characteristics before and after the scratching is performed using diamond (2 to 4 μm) for 60 minutes.

Referring to FIG. 21, there is little characteristic change in the light emission intensity before and after the scratching is performed for 60 minutes.

FIG. 22 is a graph showing EL characteristics before and after the scratching is performed using diamond (2 to 4 μm) for 120 minutes. Referring to FIG. 22, the light emission intensity after the scratching was improved by 15% or so as compared with before the scratching.

FIG. 23 is a graph illustrating the relationship between the scratching time and the light emission intensity, wherein the results are summarized according to the scratching time (10 minutes, 60 minutes, 120 minutes, and 150 minutes) with which the experiments have been performed under experimental conditions which have been illustrated with reference to FIG. 20, FIG. 21, FIG. 22, and FIG. 5.

Referring to FIG. 23, after the scratching is performed for 100 minutes, the light emission intensity starts to be improved. This is supposed to be because sapphire has a relatively higher hardness and thus is hardly scratched.

<Experiment 4>

In Experiments 1 to 3, the light emission intensity was measured from the upper surface of the light emitting diode. However, in Experiment 4, the light emission intensity from the lower portion of the substrate of the light emitting diode has also been measured in addition to the light emission intensity from the upper surface thereof.

Through this experiment, it will be confirmed whether the light exiting through the lower portion of the substrate is reflected from the outside toward the upper portion of the light emitting diode or the light is not allowed to pass through the lower portion of the substrate but collides with the uneven portions of the substrate to be reflected toward the upper portion of the light emitting diode and exits through the upper portion thereof.

This experiment was performed only under the condition of the abrasive (SiC, 0.25 μm) in which the light emission intensity was improved.

[Experimental Condition]
LED: blue light (N1371)
Methanol: 20 cc
SiC (size of 0.25 μm): 1 g
Scratching time: 150 minutes
Frequency of ultrasonic cleaning apparatus: 28 KHz
[Experimental Result]

FIG. 24 is a graph showing EL characteristics measured at an upper side of a light emitting diode before and after the scratching is performed using SiC (0.25 μm) for 150 minutes.

Referring to FIG. 24, it could be seen that the light emission intensity after the scratching was improved by about 18% as compared with before the scratching.

FIG. 25 is a graph showing IV characteristics before and after the scratching. Referring to FIG. 25, there is no change in current-voltage characteristics before and after the scratching.

FIG. 26 is a graph showing IL characteristics before and after the scratching. Referring to FIG. 26, the amount of light emitted from the upper side of the light emitting diode after the scratching is increased as compared with before the scratching.

FIG. 27 is a graph showing IL characteristics at a substrate side before and after the scratching. Referring to FIG. 27, the amount of light emitted from the substrate side after the scratching is reduced as compared with before the scratching.

The amount of light emitted from the substrate side is reduced after the scratching on the substrate of the light emitting diode is performed, whereas the light emission intensity from the upper side of the light emitting diode is increased. This means that the light exiting through the substrate due to the scratching does not cause the light emission intensity measured at the upper side of the light emitting diode to be increased, but the surface characteristics of the substrate is changed due to the scratching so that the light not exiting through the substrate is reduced and therefore the light exits toward the upper side of the light emitting diode.

It could be seen that the size of the uneven portions formed on the surface of the substrate through the substrate scratching performed in Experiments 1 to 4 is no more than about 100 nm which is smaller than the light wavelength, 400 nm. In addition, the uneven portions sized to be larger than 400 nm would be largely reduced after the scratching is performed. Therefore, it is understood that the light exiting through the substrate in the diffraction range is reduced, and instead, after colliding with the substrate, the light returns toward the upper surface of the light emitting diode.

Further, small uneven portions sized to be equal to or smaller than 50 nm are more or less generated due to the substrate scratching, so that it may be understood that the light extraction effect to the substrate side due to Rayleigh scattering would be improved. However, since the diffraction is more influential, it is understood that the light extraction effect to the substrate side is reduced overall while the uneven portions formed on the substrate cause the light to return toward the upper side of the light emitting diode so that the light extraction efficiency at the upper surface of the light emitting diode has been increased.

FIG. 28 is a sectional view illustrating a method of fabricating a light emitting diode, in which an insulation layer formed on an electrode is scratched, according to another embodiment of the present invention, showing a state where the insulation layer is scratched.

Referring to FIG. 28, a light emitting diode 200 according to the other embodiment of the present invention has semiconductor layers 220, 230, and 240 positioned on a substrate 210. The substrate 210 may be an insulative or conductive substrate. The substrate 210 may be a substrate made of sapphire ($Al_2O_3$), SiC, ZnO, Si, GaAs, GaP, lithium alumina ($LiAl_2O_3$), BN, AlN, or GaN but is not be limited thereto. The substrate 210 may be selected variously depending on materials of the semiconductor layers to be formed on the substrate 210. Further, the substrate 210 may be a substrate having upper and/or lower surfaces patterned.

The semiconductor layers 220, 230, and 240 includes a lower semiconductor layer 220, an upper semiconductor layer 240 positioned on top of the lower semiconductor layer 220, and an active layer 230 interposed between the lower semiconductor layer 220 and the upper semiconductor layer 240. Here, the lower and upper semiconductor layers 220 and 240 are made of n-type and p-type semiconductors, or p-type and n-type semiconductors, respectively.

The lower semiconductor layer 220, the active layer 230, and the upper semiconductor layer 240 may be made of gallium nitride based semiconductor materials, i.e., (B, Al, In, Ga)N. Composition elements and a composition ratio of the active layer 230 are determined so that light having a wavelength to be required, e.g., ultraviolet ray or blue light is emitted. The lower semiconductor layer 220 and the upper semiconductor layer 240 are made of a material having a bandgap larger than that of the active layer 230.

The lower semiconductor layer 220 and/or the upper semiconductor layer 240 may be formed to have a single-layered or multi-layered structure, as shown in the figure. Further, the active layer 230 may have a single quantum well structure or a multiple quantum well structure.

Meanwhile, a buffer layer (not shown) may be interposed between the semiconductor layers 220, 230, and 240 and the substrate 210. The buffer layer is employed in order to alleviate the lattice mismatch between the substrate 210 and the lower semiconductor layer 220 to be formed thereon.

Further, transparent electrodes 250 are formed on the upper semiconductor layer 240. The transparent electrode 250 allows light generated from the active layer 230 to be transmitted and allow current to be dispersedly supplied to the upper semiconductor layer 240.

An insulation layer 260 is formed on each transparent electrode 250. The insulation layer 260 may be formed of any one of $SiO_2$, $SiN_x$, $SiN_x$, $SiO_xN_y$, $InSnO_x$, and $BaTiO_x$. The insulation layer 260 covers the transparent electrode 250 so that a portion of the transparent electrode 250 is exposed. The surface of the insulation layer 260 is scratched. The surface of the insulation layer 260 is scratched using an ultrasonic cleaning apparatus and an abrasive, which will be described later. Since the surface of the insulation layer 260 is configured to have a rough surface, the light emitted from the active layer 230 or the light reflected from the substrate 210 can effectively exit.

Meanwhile, electrode pads may be formed on the transparent electrode 250, and wires (not shown) are bonded to the electrode pads. In the meantime, electrode pads (not shown) may be formed on the lower semiconductor layer 220. The electrode pads are in ohmic contact with the lower semiconductor layer 220. In addition, wires (not shown) may be in contact with the electrode pads to be electrically connected to the lower semiconductor layer 220.

FIG. 29 is a flowchart of the fabricating method of the light emitting diode shown in FIG. 28, while FIG. 30 and FIG. 31 are views illustrating the fabricating method.

Referring to FIG. 29 and FIG. 30, the substrate 210 is prepared (S21). The substrate 210 may be, for example, a sapphire substrate or a SiC substrate.

Then, the lower semiconductor layer 220, the active layer 230, and the upper semiconductor layer 240 are formed on the substrate 210 (S22). The transparent electrodes 250 are formed on the upper semiconductor layer 240 (S23). The insulation layer 260 is formed on the upper semiconductor layer 240 on which the transparent electrodes 250 are formed (S24). Here, $SiO_2$ is used as the insulation layer 260. A resist 270 is formed on the insulation layer 260 (S25). At this time, the resist 270 covers a portion of insulation layer on each transparent electrode 250 except for a portion to be exposed so that the portion of the transparent electrode 250 can be exposed later.

After the resist 270 is formed on the insulation layer 260, a hydrofluoric acid treatment is performed, so that only a portion of the insulation layer 260 defined by the resist 270 remains while the other portion thereof is patterned to expose the transparent electrodes 250 partially as shown in FIG. 31 (S26). When the hydrofluoric acid treatment is performed for 20 seconds, the insulation layer 260 can be effectively removed. Then, the resist 270 is removed (S27). In this way, the light emitting diode 200 which is not yet scratched is completed.

An abrasive is prepared (S28). The abrasive is made of any one of diamond, SiC, cubic boron nitride (cBN), diamond like carbon (DLC) and a mixture thereof, which are materials having Mohs' hardness equal to or larger than that of sapphire, i.e., 9. The prepared abrasive is prepared to be mixed into a solvent. Methanol or ethanol may be used as the solvent.

An ultrasonic cleaning apparatus is prepared (S29). As shown in FIG. 4, any ultrasonic cleaning apparatus capable of generating ultrasonic waves in a sonic, ultrasonic or megasonic region may be used as the ultrasonic cleaning apparatus.

The solvent having an abrasive 301 mixed therein is put into the ultrasonic cleaning apparatus 300, the substrate 210 in which the insulation layer 260 is formed on the transparent electrodes 250 is positioned therein, and then, ultrasonic waves are generated to activate the abrasive 301 (S30). At this time, the insulation layer 260 to be scratched is positioned to face downward in the ultrasonic cleaning apparatus 300.

When the ultrasonic vibration is generated in the ultrasonic cleaning apparatus 300, the abrasive 301 is activated in the ultrasonic cleaning apparatus 300 to rub the surface of the insulation layer 260 formed on the transparent electrodes 250.

The rubbing with the abrasive 301 causes the surface of the insulation layer 260 to be irregularly worn away and to be roughly scratched as shown in FIG. 28.

The roughness and shape in the surface of the insulation layer 260 may be changed without limit depending on the particle size of the abrasive 301 and the ultrasonic wave generation time of the ultrasonic cleaning apparatus. Then, the upper semiconductor layer 240 and the active layer 230 are partially etched out to partially expose the lower semiconductor layer 220. Other electrodes (not shown) are formed on the exposed lower semiconductor layer 220.

Then, through a diamond or laser scribing, the light emitting diode 200 is separated into individual light emitting diodes, which are completely fabricated.

Hereinafter, the improved characteristics of the light emitting diode according to the embodiment of the present invention will be shown through various experimental examples.

<Experiment 5>

In Experiment 5, the surface of the insulation layer formed on the transparent electrode of the light emitting diode was scratched using diamond as the abrasive, and then, it was measured how much the light emission intensity of the light emitting diode after the scratching is increased as compared with before the scratching.

[Experimental Condition]
LED: blue light (N1622)
Methanol: 10 cc
Diamond (size of 2 to 4 µm): 500 mg
Scratching time: 3 minutes
Frequency of ultrasonic cleaning apparatus: 28 KHz
Hydrofluoric acid treatment time: 20 seconds
Deposition thickness of $SiO_2$: 15 µm
[Experimental Result]

FIG. 32 is a graph showing EL characteristics before and after the scratching, FIG. 33 is a graph showing IV characteristics before and after the scratching, and FIG. 34 is a graph showing IL characteristics before and after the scratching.

Referring to FIG. 32, it could be seen that the light emission intensity after the scratching was improved by about 25% as compared with before the scratching.

Meanwhile, referring to FIG. 33, the current-voltage characteristics were changed after the scratching as compared with before the scratching. It is understood that since the insulation layer is formed not to entirely cover the transparent electrode but to partially expose it, a portion of the transparent electrode is scratched when the scratching is performed, and therefore, the upper semiconductor layer may be influenced when the hydrofluoric acid treatment is performed In the meantime, referring to FIG. 34, it could be seen that the amount of emitted light after the scratching was increased by about 20% due to EL characteristics.

Referring to FIG. 32, FIG. 33, and FIG. 34, it could be seen that the light emission efficiency was increased through the scratching. In order to confirm which operation of the scratching causes the light emission efficiency to be improved, AFM photographs of the substrate before and after the scratching were compared with each other.

AFM photographs of a sapphire substrate are taken in two ranges. That is, in order to examine the distribution of the uneven portions which cause the light to be scattered, AFM photographs in 2 µm range were taken to be compared with each other. In addition, in order to examine the distribution of the uneven portions which cause the light to be refracted or reflected, AFM photographs in 20 µm range were taken to be compared with each other.

FIG. 35 is an AFM photograph of a transparent electrode in 2 µm range, FIG. 36 is an AFM photograph (in 2 µm range) of an insulation layer before the scratching is performed, and FIG. 37 is an AFM photograph (in 2 µm range) of an insulation layer after the scratching is performed.

When FIG. 35 and FIG. 36 are compared with each other, it can be seen that the insulation layer shown in FIG. 36 is deposited based on the transparent electrode shown in FIG. 35. In addition, when FIG. 36 and FIG. 37 are compared with each other, it can be seen that a plurality of uneven portions sized to be 0 to 100 nm are formed on the surface of the insulation layer after the scratching. It is understood that these uneven portions cause Rayleigh scattering to occur, thereby improving the light emission intensity.

FIG. 38 is an AFM photograph (in 20 µm range) of a surface of an insulation layer before the scratching is performed, and FIG. 39 is an AFM photograph (in 20 µm range) of a surface of an insulation layer after the scratching is performed.

When FIG. 38 and FIG. 39 are compared with each other, there is no specific change in the surface after the scratching as compared with before the scratching.

That is, from the results shown in FIG. 35, FIG. 36, FIG. 37, FIG. 38, and FIG. 39, it is understood that the light emission intensity is improved by 25%, which is largely influenced by Rayleigh scattering in 2 µm range.

<Experiment 6>

The light emission intensity is improved by scratching the insulation layer formed on the transparent electrode, and accordingly, in order to examine which operation causes the light emission intensity to be improved, an angular distribution of the light emission intensity in a range of 0 to 180 degrees was measured in Experiment 6.

[Experimental Condition]
LED: blue light (N1622)
Methanol: 10 cc
Diamond (size of 2 to 4 µm): 500 mg
Scratching time: 3 minutes and 6 minutes
Frequency of ultrasonic cleaning apparatus: 28 KHz
Hydrofluoric acid treatment time: 20 seconds
Deposition thickness of $SiO_2$: 15 µm
[Experimental Result]

FIG. 40 is a graph illustrating the relationship between the scratching time and the light emission intensity, and FIG. 41 is a graph illustrating angular distribution characteristics of the light emission intensity before and after the scratching. Referring to FIG. 40 and FIG. 41, the light emission intensity was maximally improved when the scratching is performed for 3 minutes. Further, when the scratching is performed for 6 minutes, the light emission intensity was improved as compared with before the scratching, but reduced as compared with the case where the scratching is performed for 3 minutes. In addition, it could be confirmed that in the cases of both 3 minute scratching and 6 minute scratching, the light emission intensity was isotropically improved.

FIG. 42 is an AFM photograph (in 2 µm range) of an insulation layer before the scratching is performed, FIG. 43 is an AFM photograph (in 2 µm range) of an insulation layer after the scratching is performed for 3 minutes, and FIG. 44 is an AFM photograph (in 2 µm range) of an insulation layer after the scratching is performed for 6 minutes.

When FIG. 43 and FIG. 44 are compared with each other, it could be confirmed that deeper uneven portions were formed on the surface of the insulation layer after the 3 minute scratching shown in FIG. 43 as compared with the 6 minute scratching shown in FIG. 44. This is because the insulation layer is totally worn away if the scratching is performed for 6 minutes. Since the light emission intensity is maximally improved in the case of the 3 minute scratching, it is understood that the light emission intensity is largely influenced by Rayleigh scattering.

FIG. 45 is an AFM photograph (in 20 µm range) of an insulation layer before the scratching is performed, FIG. 46 is an AFM photograph (in 20 µm range) of an insulation layer after the scratching is performed for 3 minutes, and FIG. 47 is an AFM photograph (in 20 µm range) of an insulation layer after the scratching is performed for 6 minutes.

When FIG. 46 and FIG. 47 are compared with each other, it can be seen that uneven portions are more or less formed through the scratching, but the difference is insignificant as compared with the uneven portions formed on the sapphire substrate after the scratching as described in Experiments 1 to 4. Accordingly, it can be understood that the light extraction effect due to the diffraction would be more or less reduced. However, since Rayleigh scattering is more influential, it is understood that the light extraction efficiency in the insulation layer is improved.

As described in Experiments 5 and 6, unlike the scratching on the substrate, the reduction of the uneven portions in the diffraction range is little detected in the case of the scratching on the insulation layer formed on the transparent electrode. It could be seen that the reduction of the uneven portions in the scratching on the sapphire substrate causes the light extraction effect to the substrate side to be deteriorated, but the reduction of the uneven portions in the scratching on the surface of the insulation layer is smaller and therefore the light extraction efficiency due to Rayleigh scattering is improved. Further, regarding the angular distribution of the light emission intensity, the light emission intensity was isotropically improved after the scratching is performed as compared with before the scratching.

FIG. 48 is a graph showing light emission angle characteristics of a light emitting diode according to a comparative example, and FIG. 49 is a photograph showing a surface of the light emitting diode according to the comparative example.

FIG. 48 and FIG. 49 show the experimental result of J. K. Sheu at National Cheng Kung University in Taiwan, wherein a P layer is damaged in the experiment of J. K. Sheu and uneven portions are uniformly formed on a surface as shown in FIG. 49. Accordingly, it can be seen from the experiment of J. K. Sheu that the light emission intensity is improved only in a certain direction as shown in FIG. 48. However, the light emission angle is isotropically improved in the graph illustrating light emission angle characteristics of the light emitting diode according to the present invention shown in FIG. 41. This difference in light emission angle characteristics is because the uneven portions in the comparative example are uniformly distributed to thereby improve the light emission intensity in a certain direction, whereas in the light emitting diode according to the present invention, the ultrasonic wave is used to activate the abrasive to irregularly form the uneven portions on the surface of the insulation layer, thereby isotropically improving the light emission intensity.

However, the present invention is not limited to the aforementioned embodiments but may be variably modified and changed by a person skilled in the art. Such modifications and changes are included within the spirit and scope of the present invention defined by the appended claims.

For example, it has been described that a sapphire substrate is scratched in the embodiments of the present invention. However, it can be seen that the present invention may be applied to any other substrate conventionally used since any other substrate may be used instead of the sapphire substrate only if the substrate may be scratched by an abrasive using the ultrasonic vibration.

In addition, it has been described that $SiO_2$ is used as an insulation layer in the embodiments of the present invention. However, the present invention is not limited thereto but may be applied to any other insulation layer made of other materials.

Further, it has been described that an ultrasonic cleaning apparatus is used to scratch a surface of a substrate or a surface of an insulation layer in the embodiments of the present invention. However, the present invention is not limited thereto but may be applied to any other ultrasonic vibration apparatus since any other ultrasonic vibration apparatus may be used only if it can vibrate the abrasive to scratch a surface of a light emitting diode.

Furthermore, although it has been described in the embodiments of the present invention that a lower semiconductor layer, an active layer, an upper semiconductor layer and an electrode are formed on a substrate and then the substrate is scratched, it is possible to approve any modified embodiment, in which scratching is performed, an electrode is formed, and a lower semiconductor layer is exposed to form a lower electrode. In addition, it is also possible to approve any embodiment, in which a lower semiconductor layer, an active layer, an upper semiconductor layer and an electrode are formed on a substrate, the lower semiconductor is exposed to form the lower electrode, the upper layer is protected with the electron wax layer, and then the substrate is scratched.

Moreover, although it has been described in the embodiments of the present invention that a surface of a substrate or a surface of an insulation layer is scratched, it can be seen that it is included within the spirit and scope of the present invention that after a substrate is scratched, a surface of an insulation layer is scratched through an additionally process. Further, for example, a lower semiconductor layer, an active layer, an upper semiconductor layer and an electrode are formed on a substrate, the lower semiconductor layer is exposed to form an electrode, the upper semiconductor layer is protected with an electron wax layer, the substrate is scratched, the electron wax which covers the upper semiconductor layer is removed, and then the surface of the insulation layer is scratched, whereby it is possible to improve the light extraction efficiency through the scratching of the substrate and the light extraction efficiency through the scratching of the insulation layer.

The invention claimed is:

1. A method of fabricating a light emitting diode, comprising:
    forming a compound semiconductor layer on a substrate, wherein the compound semiconductor layer comprises a lower semiconductor layer, an active layer and an upper semiconductor layer;
    forming an electron wax layer on the upper semiconductor layer; and
    scratching a surface of the substrate, after the forming of the electron wax layer.

2. A method of fabricating a light emitting diode, comprising:
    forming a compound semiconductor layer on a substrate, the compound semiconductor layer comprising a lower semiconductor layer, an active layer, and an upper semiconductor layer;
    positioning a solvent comprising an abrasive mixed therein into an ultrasonic cleaning apparatus;
    positioning the substrate with the compound semiconductor layer formed thereon in the ultrasonic cleaning apparatus; and applying ultrasonic waves in the ultrasonic cleaning apparatus to perform the scratching through activation of the abrasive.

3. The method of claim 2, wherein positioning the substrate comprises positioning the substrate to face downward in the ultrasonic cleaning apparatus.

4. The method of claim 2, wherein the abrasive comprises a diamond with a diameter of 1 to 20 μm.

5. The method of claim 4, wherein the diamond has a diameter of 2 to 4 μm.

6. The method of claim 2, wherein the abrasive comprises a SiC with a diameter of 0.1 to 11.5 μm.

7. The method of claim 6, wherein the SiC has a diameter of 0.1 to 3 μm.

8. The method of claim 2, wherein the abrasive comprises one of diamond, SiC, cubic boron nitride (cBN), and diamond like carbon (DLC).

9. The method of claim 2, further comprising:
forming at least one electrode on the compound semiconductor layer;
forming an insulation layer on the electrode; and
scratching a surface of the insulation layer.

10. A method of fabricating a light emitting diode, comprising:
forming a compound semiconductor layer on a substrate, the compound semiconductor layer comprising a lower semiconductor layer, an active layer, and an upper semiconductor layer;
forming at least one electrode on the compound semiconductor layer;
forming an insulation layer on the electrode; and
rubbing the insulation layer with an abrasive comprising one of diamond, SiC, cubic boron nitride (cBN), and diamond like carbon (DLC).

11. A method of fabricating a light emitting diode, comprising:
forming a compound semiconductor layer on a substrate, the compound semiconductor layer comprising a lower semiconductor layer, an active layer, and an upper semiconductor layer;
forming at least one electrode on the compound semiconductor layer;
forming an insulation layer on the electrode;
positioning a solvent comprising an abrasive mixed therein into an ultrasonic cleaning apparatus;
positioning the substrate with the insulation layer formed thereon in the ultrasonic cleaning apparatus; and
applying ultrasonic waves in the ultrasonic cleaning apparatus to scratch the insulation layer through activation of the abrasive.

12. The method of claim 11, wherein positioning the substrate comprises positioning the substrate so that the insulation layer faces downward in the ultrasonic cleaning apparatus.

13. The method of claim 10, wherein forming the insulation layer comprises:
forming the insulation layer on the compound semiconductor layer comprising the at least one electrode formed thereon; and
patterning the insulation layer so that a portion of the at least one electrode is exposed.

14. The method of claim 10, wherein the insulation layer comprises any one of $SiO_2$, $SiN_x$, $SiO_x$, $SiO_xN_y$, $InSnO_x$, and $BaTiO_x$.

15. The method of claim 14, wherein the abrasive comprises diamond with a diameter of 2 to 4 μm.

16. A light emitting diode, comprising:
a substrate comprising an irregularly scratched surface;
a compound semiconductor layer comprising a lower semiconductor layer, an active layer and an upper semiconductor layer disposed on the substrate,
at least one electrode disposed on the compound semiconductor layer; and
an insulation layer disposed on the upper surface of the electrode,
wherein the insulation layer comprises an irregularly scratched surface.

17. A light emitting diode, comprising:
a substrate;
a compound semiconductor layer comprising a lower semiconductor layer, an active layer and an upper semiconductor layer disposed on the substrate;
at least one electrode disposed on the compound semiconductor layer; and
an insulation layer disposed on the upper surface of the electrode,
wherein the insulation layer has an irregularly scratched surface.

18. The light emitting diode of claim 16, wherein the insulation layer comprises any one of $SiO_2$, $SiN_x$, $SiO_x$, $SiO_xN_y$, $InSnO_x$ and $BaTiO_x$.

19. The light emitting diode of claim 16, wherein the scratched surface of the insulation layer comprises uneven portions, each uneven portion being sized to be larger than 0 nm and equal to or smaller than 100 nm.

20. The light emitting diode of claim 17, wherein the insulation layer comprises any one of $SiO_2$, $SiN_x$, $SiO_x$, $SiO_xN_y$, $InSnO_x$, and $BaTiO_x$.

21. The light emitting diode of claim 17, wherein the scratched surface of the insulation layer comprises uneven portions, each uneven portion being sized to be larger than 0 nm and equal to or smaller than 100 nm.

22. The method of claim 2, further comprising forming an electron wax layer on the upper semiconductor layer before the scratching of the surface of the substrate.

23. The method of claim 11, wherein the forming of the insulation layer comprises:
forming the insulation layer on the compound semiconductor layer comprising the at least one electrode formed thereon; and
patterning the insulation layer so that a portion of the at least one electrode is exposed.

* * * * *